(12) United States Patent
Hanada et al.

(10) Patent No.: US 7,168,161 B2
(45) Date of Patent: Jan. 30, 2007

(54) MANUFACTURING METHOD OF SOLID-STATE IMAGE SENSING DEVICE

(75) Inventors: Kenji Hanada, Kodaira (JP); Akio Ishizu, Maruko (JP)

(73) Assignees: Renesas Technology Corp., Tokyo (JP); Renesas Eastern Japan Semiconductor Inc., Tokyo (JP)

( * ) Notice: Subject to any disclaimer, the term of this patent is extended or adjusted under 35 U.S.C. 154(b) by 351 days.

(21) Appl. No.: 10/659,433

(22) Filed: Sep. 11, 2003

(65) Prior Publication Data

US 2005/0048692 A1 Mar. 3, 2005

(30) Foreign Application Priority Data

Aug. 25, 2003 (JP) .............................. 2003-300217

(51) Int. Cl.
*H05K 3/30* (2006.01)
*H01L 21/48* (2006.01)

(52) U.S. Cl. .............................. 29/841; 29/832; 29/834; 29/855; 29/592.1; 438/106; 438/124; 257/291

(58) Field of Classification Search .......... 29/830–835, 29/841, 845, 855, 856, 593, 592.1; 438/106, 438/124, 46–48; 257/292, 132, 666, 704; 361/767–770; 264/272.15, 272.17
See application file for complete search history.

(56) References Cited

U.S. PATENT DOCUMENTS 5,098,630 A * 3/1992 Ogiu et al. ............ 264/272.15

5,438,216 A * 8/1995 Juskey et al. ................ 257/434
6,383,835 B1 * 5/2002 Hata et al. ..................... 438/65
6,579,748 B1 * 6/2003 Okuno et al. ................ 438/124
6,813,103 B2 * 11/2004 Tansho et al. ............... 359/819

FOREIGN PATENT DOCUMENTS

| JP | 2001-245217 | 3/2000 |
|---|---|---|
| JP | 3084092 | 5/2001 |
| JP | 2003-32557 | 7/2001 |
| JP | 2003-78077 | 9/2001 |
| JP | 2003-78122 | 9/2001 |

* cited by examiner

*Primary Examiner*—Minh Trinh
(74) *Attorney, Agent, or Firm*—Reed Smith LLP; Stanley P. Fisher, Esq.; Juan Carlos A. Marquez, Esq.

(57) ABSTRACT

In a method of manufacturing a camera module having a CMOS image sensor, a semiconductor chip to serve as a light sensor is mounted on a optical-component-mounting face of a wiring substrate mother board and, after bonding wires are connected to the semiconductor chip, a lens barrel is joined to the wiring substrate mother board so as to cover the semiconductor chip. A position adjustment pin and a through hole are provided on the lens barrel and the wiring substrate mother board respectively outside a junction face between the lens barrel and the wiring substrate mother board to be used for adjusting the position of the lens barrel with respect to the wiring substrate mother board by inserting the position adjustment pin into the through hole.

8 Claims, 20 Drawing Sheets

MANUFACTURING METHOD OF SOLID-STATE IMAGE SENSING DEVICE

TECHNICAL FIELD OF THE INVENTION

The present invention relates to a method of manufacturing a solid-state image sensing device.

BACKGROUND OF THE INVENTION

A solid-state image sensing device is a photo-electric conversion device for converting an optical signal of image into an electric signal by using an array of pixels. On a first face of the substrate of the solid-state image sensing device, an image sensing element is placed with its light reception face oriented upward. Over the image sensing element, a filter is provided and a lens is provided on the filter in a bottom-up order to form a stack supported on a frame. The frame is placed on the first face in such a way that the position of the lens coincides with the position of the image sensing element.

A technology prescribing a relation between the position of an image sensing element and the position a lens on a solid-state image sensing device is described in documents such as Japanese Patent Laid-open No. 2001-245217. In accordance with this document, a protrusion for positioning use is provided at the bottom of a mirror frame of a image-taking module having a small size, and a hole to be engaged with the protrusion for positioning use is provided at a location relative to a reference position on a substrate for installing the frame.

In addition, in accordance with a Registered Utility Model No. 3,084,092, a protrusion on the lower face of a cover glass installation pedestal base is engaged with a through hole on a circuit substrate on which the solid-state image sensing device is installed so as to provide a configuration in which the cover glass installation pedestal base is installed at an accurate position on the circuit substrate.

SUMMARY OF THE INVENTION

However, the inventors of the present invention discovered that the solid-state image sensing device had the following problems.

With miniaturization of the solid-state image sensing device and more advanced functions added to the solid-state image sensing device, there is resulted in a configuration in which electronic components for controlling the image sensing element and other electronic components or the like are provided on a second face on a side opposite to the first face of the substrate of the solid-state image sensing device, and those components are encapsulated by using resin. If a position adjustment hole provided on the substrate as a hole for adjusting the position of the frame (that is, the lens) with respect to the image sensing element penetrates the substrate to a resin creation area on the second face of the substrate, some resin will protrude from the second face of the substrate to the first face through the position adjustment hole in an encapsulation process. The protruding resin raises a problem of formation of resin fins, resin flashes or the like and fills up the position adjustment hole. If the frame is mounted on the second face in this state, a small gap is formed between the frame and the second face. As a result, there is raised another problem that small foreign matters are injected into the frame by way of the small gap and stuck on an array of sensors, much increasing a rate of generation of black-point defects. A high rate of generation of black-point defects in turn lowers the yield of a camera module to an extremely small value. In order to avoid these problems, there is conceived a solution to temporarily fill up the position adjustment hole with a material prior to the encapsulation process. However, this solution raises a further problem that it is difficult to select a suitable material with which the position adjustment hole is to be temporarily filled up and, even if the position adjustment hole is filled up with such a suitable material, the temporary filler material will be pushed out from the position adjustment hole by a resin injection pressure applied in the encapsulation process.

In addition, if a position adjustment pin exists on an adhesion face of the frame (that is, the mirror frame or the cover glass installation pedestal base) as is described in Japanese Patent Laid-open No. 2001-245217 and the Registered Utility Model No. 3,084,092, the uniformity of a bonding agent on the adhesion face is lost due to the existence of the position adjustment pin. As a result, the frame does not well adhere to the substrate, forming a gap between the substrate and the frame. Accordingly, there is raised a problem of a much decreasing yield of the solid-state image sensing device for the same reason as that described above.

It is thus an object of the present invention addressing the problems described above to provide a technology for increasing the yield of the solid-state image sensing device.

The above and other objects of the present invention as well as novel characteristics thereof will probably become apparent from a study of the descriptions provided in this specification with reference to their accompanying diagrams.

Outlines of representatives of the inventions disclosed in this specification are described briefly as follows.

In accordance with the present invention, a hole formed on a substrate as a hole for adjusting the position of an image sensing element with respect to a frame is provided outside an encapsulation body in a process of manufacturing a solid-state image sensing device.

In addition, in accordance with the present invention, a position adjustment pin provided on a frame as a pin for adjusting the position of an image sensing element with respect to the frame as well as a hole formed on a substrate are provided outside a junction face between the frame and the substrate in a process of manufacturing a solid-state image sensing device.

Effects exhibited by the representatives of the inventions disclosed in this specification are described as follows.

Since a hole formed on a substrate as a hole for adjusting the position of an image sensing element with respect to a frame is formed outside an encapsulation body in a process of manufacturing a solid-state image sensing device, the yield of the solid-state image sensing device can be increased.

BRIEF DESCRIPTIONS OF THE DRAWINGS

DESCRIPTION OF THE PREFERRED EMBODIMENTS

Figure 1:
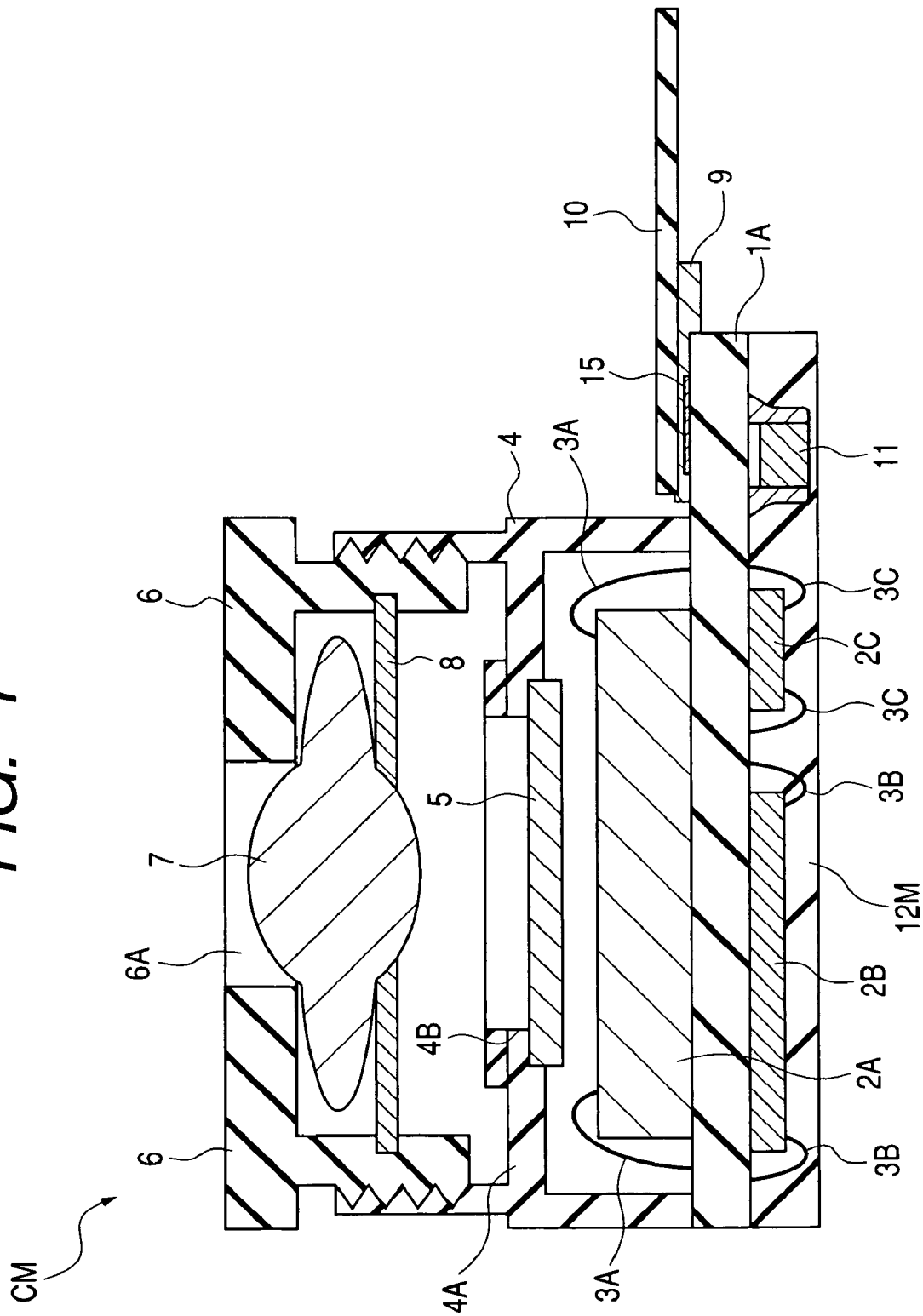
FIG. 1 is a diagram showing a typical cross section of a solid-state image sensing device implemented by an embodiment of the present invention.

If necessary, in the following description, each embodiment is explained by splitting the embodiment into a plurality of sections or a plurality of sub-embodiments and, unless otherwise specified, the sections or the sub-embodiments are not unrelated to each other. Instead, one section or one sub-embodiment is an implementation obtained by modifying a portion or all of another section or another sub-embodiment, or one section or one sub-embodiment is related to another section or another sub-embodiment in that the former is a detailed or supplementary explanation of the latter. In addition, a quantity mentioned in the embodiments described below does not mean a specific magnitude of the quantity, but may be greater or smaller than the specific magnitude of the quantity unless it is specified explicitly in particular or it is obvious from a known principle that the quantity is limited to the specific magnitude of the quantity. In this case, the quantity represents the number of elements, the number of items, a numerical value, an amount, a range and the like. Furthermore, a configuration element including an element step and the like in the embodiments described below is of course not necessarily required absolutely unless it is specified explicitly in particular or it is obvious from a known principle that the configuration element is considered to be absolutely required. Similarly, the shape, a positional relation or the like of a configuration element or the like mentioned in the embodiments described below in essence implies a shape, a positional relation or the like, which is close or similar to the mentioned shape, the mentioned positional relation or the like unless it is specified explicitly in particular or it is obvious from a known principle that the mentioned shape, the mentioned positional relation or the like conceivably means neither other shapes, other positional relations nor the like. These broad implications of the shape, a positional relation or the like of a configuration element or the like hold true of the aforementioned numerical value and the aforementioned range. Moreover, in a diagram used for explaining an embodiment, a hatched portion may be included, even if the diagram is a diagram showing a top view, in order to make the drawing easy to inspect. In addition, identical members shown in different drawings used for explaining embodiments are basically denoted by the same reference numeral, and their explanation is given only once. The embodiments of the present invention are explained in detail by referring to diagrams as follows.

The solid-state image sensing device implemented by an embodiment is a camera module employed in a picture input unit of an apparatus such as a portable telephone, a TV telephone, a PC camera, a PDA (Personal Digital Assistant), an optical mouse, a door phone, a monitoring camera, a fingerprint recognition apparatus or a toy.

The following embodiments implement the present invention applied to a camera module of a 110,000-pixel CMOS (Complementary Metal Oxide Semiconductor) sensor type compatible with a CIF (Common Immediate Format).

FIG. 1 is a diagram showing a typical cross section of an embodiment implementing a CM (camera module) of the CMOS sensor type. A wiring substrate 1A of this camera module CM is a 4-layer print wiring substrate using typically resin of the glass epoxy group as an electrical-insulation material. The wiring substrate 1A has a second face serving as a face for mounting optical components and a first face on the side opposite to the second face. The first face is a face for mounting system components. On the optical-component-mounting face of the wiring substrate 1A, a semiconductor chip 2A for optical-sensor use is mounted with its principal face oriented upward. The semiconductor chip 2A is known as a second electronic component, which is referred to hereafter simply as a sensor chip. The principal face of the sensor chip 2A is a light reception face or a face on which light reception elements are mounted. On the principal face of the sensor chip 2A, a CMOS image sensor circuit is formed. This CMOS image sensor circuit is made in a CMOS process used as a standard process in a process to fabricate a semiconductor device. The CMOS image sensor circuit has a sensor array and an analog circuit for processing an electrical signal generated by the sensor array. The sensor array comprises a plurality of light reception elements regularly arranged in the longitudinal and transversal directions on the principal face of the sensor chip 2A. Each of the light reception elements is a pixel formed in the CMOS image sensor circuit and has a photo-electric conversion function to convert an incident optical signal into an electrical signal. As the light reception element, typically, a photo diode or a photo transistor is used. On the outer circumference of the principal face of the sensor chip 2A, a plurality of bonding pads is provided. Arranged along the outer circumference, the bonding pads are each formed as a drawn electrode of the CMOS image sensor circuit. A bonding pad is electrically connected to a wire and land (electrode) of the wiring substrate 1A by a bonding wire 3A. The bonding wire 3A is made from a material such as gold (Au).

In addition, a lens barrel (frame) 4 is mounted on the optical-component-mounting face of the wiring substrate 1A to cover the sensor chip 2A. The lens barrel 4 is mounted on the optical-component-mounting face of the wiring substrate 1A in such a state that the planar position thereof relative to the sensor chip 2A is adjusted with respect to the sensor chip 2A. The lens barrel 4 is made of an insulation material such as PBT (Poly Butylene Terephthalate). The bottom of the foot portion of the lens barrel 4 is bonded substantially on the optical-component-mounting face of the wiring substrate 1A by using a bonding agent. In the cylinder of the lens barrel 4, there is provided a dashboard 4A for partitioning upper and lower chambers from each other. At the center of the dashboard 4A, there is formed a plane rectangular opening 4B penetrating the dashboard 4A from the upper face to lower face of the dashboard 4A. The opening 4B is formed at a position exposed to the sensor array of the sensor chip 2A. The opening 4B is blocked up with an IR filter 5 installed on the dashboard 4A. The IR filter 5 has a function of passing through visible rays but blocking unnecessary infrared rays having frequencies of at least a predetermined value. A lens holder (or a lens-holding unit, which is a member of a lens assembly) 6 is installed on the head of the lens barrel 4 to block up an opening of the head of the lens barrel 4. The lens holder 6 and the lens barrel 4 are linked to each other by engaging a screw formed on the inner circumferential face of a cylinder on the head of the lens barrel 4 with another screw formed on an outer circumferential face of the lower portion of the lens holder 6. The state of linking the lens holder 6 to the lens barrel 4 is kept substantially by further coating the outer circumference of the linkage portion of the lens holder 6 and the lens barrel 4 with a bonding agent. The lens holder 6 is made of typically the same material as the lens barrel 4. An optical lens 7 is accommodated inside the lens holder 6 in a state of being substantially supported by a back diaphragm made of a metal. The optical lens 7 is made of an inexpensive and light material such as plastic and is set at a position exposed to the sensor array on the principal face of the chip sensor 2. On the upper face of the lens holder 6, a light reception window 6A having typically a plane circular shape is opened with its relative planar position adjusted with respect to the optical lens 7. An external-field ray of the camera module CM is radiated to the sensor array of the chip sensor 2A by way of the light reception window 6A, the optical lens 7 following the light reception window 6A and the IR filter 5 following the optical lens 7.

In addition, a plurality of connection terminals 15 is provided on the optical-component-mounting face of the wiring substrate 1A. The connection terminals 15 are laid out along one side of the wiring substrate 1A. The connection terminals 15 are terminals electrically connecting a circuit inside the camera module CM to an external apparatus. To put it in detail, the connection terminals 15 are electrically connected to the circuit inside the camera module CM by wires of the wiring substrate 1A. On the other hand, the connection terminals 15 are electrically connected to wires of a flexible wiring substrate 10 by a junction member 9 such as an ACF (Anisotropic Conductive Film). The flexible wiring substrate 10 is further electrically connected to the external apparatus.

Other components are also mounted on the system-component-mounting face of the wiring substrate 1A. The other components include a logic-use semiconductor chip 2B, a memory-use semiconductor chip 2C and a chip component 11. The logic-use semiconductor chip 2B is a first electronic component referred to hereafter simply as a logic chip. The memory-use semiconductor chip 2C is also a first electronic component referred to hereafter simply as a memory chip. Likewise, the chip component 11 is also a first electronic component. The logic chip 2B, the memory chip 2C and the chip component 11 are electronic components for mainly processing an electrical signal generated by the sensor chip 2A. The logic chip 2B, the memory chip 2C and the chip component 11 are also electronic components used for constructing a system for controlling the operation of the CMOS image sensor circuit of the sensor chip 2A. The logic chip 2B includes a circuit formed thereinto serve as a processing circuit carrying out digital-signal processing. An example of the processing circuit is a DSP (Digital Signal Processor). The logic chip 2B is electrically connected to lands (electrodes) and wires of the wiring substrate 1A by bonding wires 3B. The memory chip 2C includes a circuit formed therein to serve as a non-volatile memory circuit. An example of the non-volatile memory circuit is an EEPROM (Electrically Erasable Programmable Read Only Memory). The memory chip 2C is also electrically connected to lands (electrodes) and wires of the wiring substrate 1A by bonding wires 3C. The bonding wires 3C are made of typically gold (Au). The chip component 11 includes elements formed therein to serve as passive elements such as capacitors and resistors. Electrodes of the chip component 11 are joined to lands (electrodes) of the wiring substrate 1A by typically soldering to form electrical connections with the lands. Components such as the logic chip 2B, the memory chip 2C, the chip component 11 as well as the bonding wires 3B and 3C, which are mounted the system-component-mounting face of the wiring substrate 1A, are encapsulated by an encapsulation body 12M. The encapsulation body 12M is made from resin having a heat-curing characteristic. An example of such resin is resin of the epoxy group including silica fillers.

The following description explains a typical method of manufacturing the camera module described above.

Figure 2:
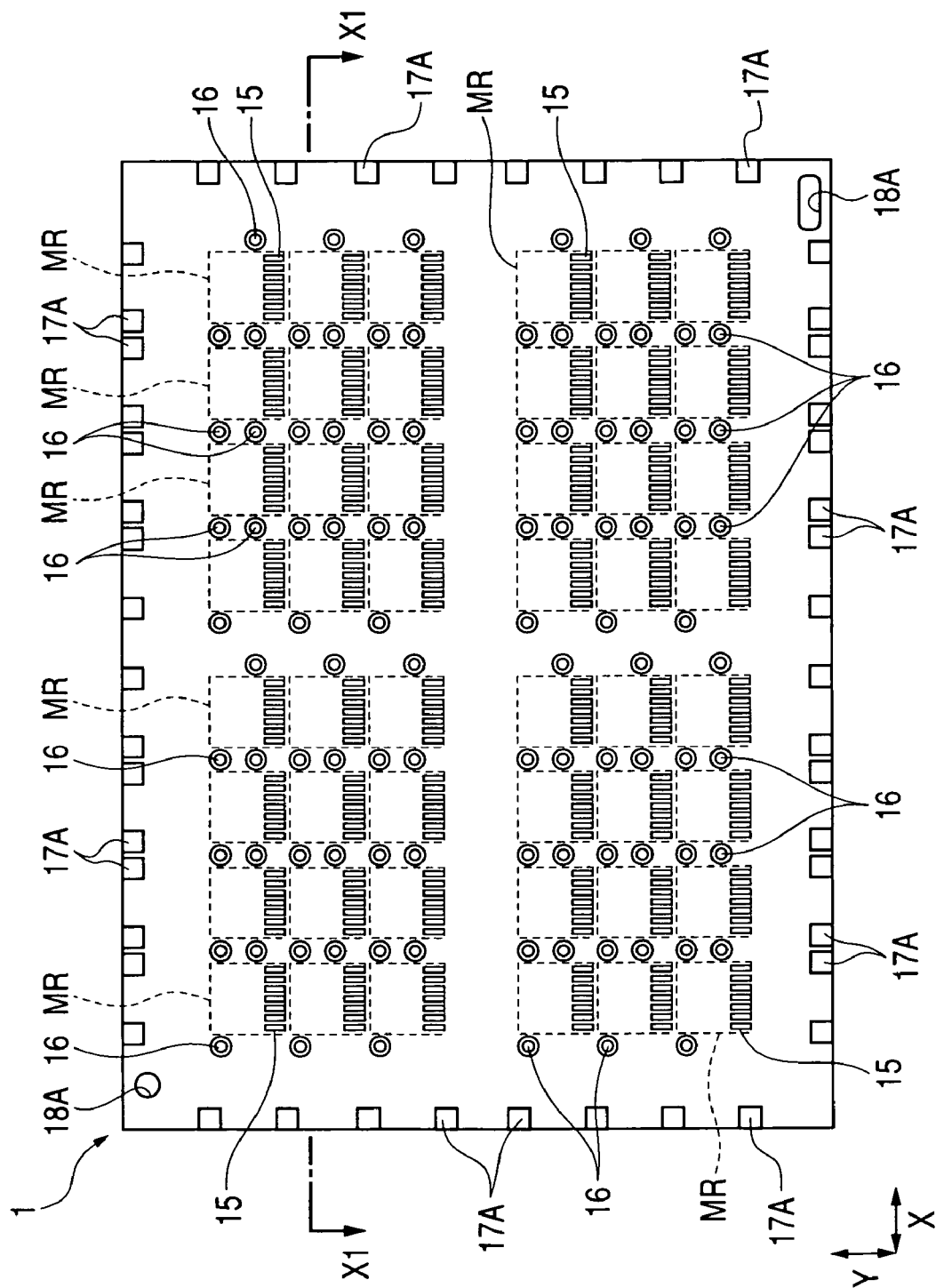
FIG. 2 is a diagram showing a top view of an entire second face of a wiring substrate mother board used in a process to manufacture the solid-state image sensing device shown in FIG. 1.
Figures 3, 4:
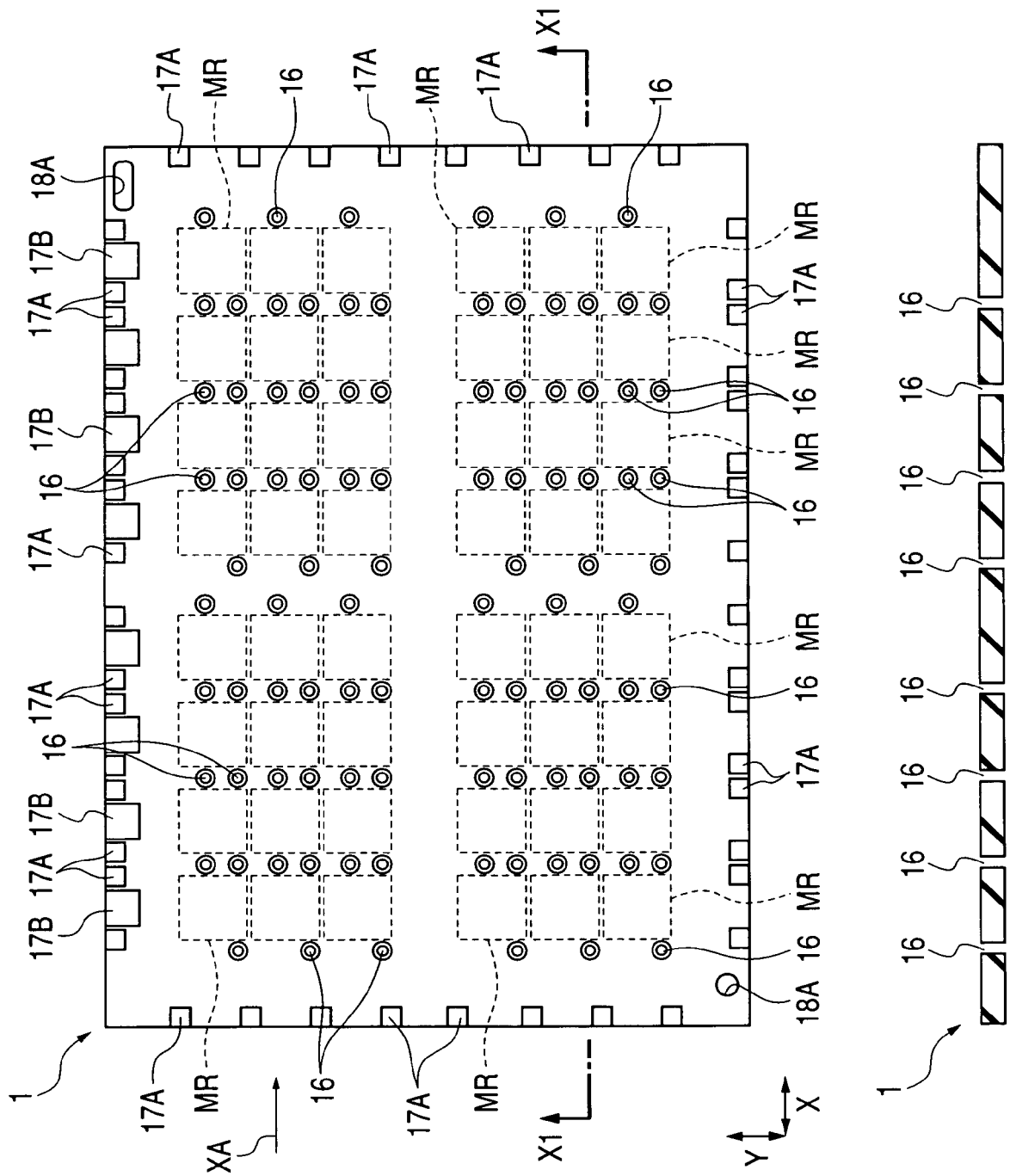
FIG. 3 is a diagram showing a top view of an entire first face on a side opposite to the second face shown in FIG. 2.
FIG. 4 is a diagram showing a cross section along an X1—X1 line shown in FIGS. 2 and 3.

First of all, a wiring substrate mother board 1 such as ones shown in FIGS. 2 to 4 is prepared. FIG. 2 is a diagram showing a top view of the entire optical-component-mounting face of the wiring substrate mother board 1. FIG. 3 is a diagram showing a top view of the entire system-component-mounting face on a side opposite to the optical-component-mounting face shown in FIG. 2. FIG. 4 is a diagram showing a cross section along an X1—X1 line shown in FIGS. 2 and 3. It is to be noted that, in FIGS. 1 and 2, notation X denotes a first direction and notation Y denotes a second direction perpendicular to the first direction X.

The wiring substrate mother board 1 is the mother board of the wiring substrate 1A. The plane shape of the wiring substrate mother board 1 is typically rectangular. The thickness of the wiring substrate mother board 1 is extremely small, having a typical value of the order of 0.3 mm. The wiring substrate mother board 1 has a structure comprising 4 wiring layers having typically resin of the glass epoxy group as a material for electrically insulating the wiring layers from each other. The wiring substrate mother board 1 is formed by adoption of typically a subtractive method. Typically, copper (Cu) is used as a wiring material of the wiring substrate mother board 1.

Typically, 48 module regions MR each used for creation of a camera module are arranged regularly on the wiring substrate mother board 1 with a uniform orientation as shown as dashed-line blocks in FIGS. 2 and 3. Each of the module regions MR is a unit area required for manufacturing a camera module CM. A plurality of connection terminals 15 is laid out to form an array in each of the module regions MR on the optical-component-mounting face. In addition, lands (electrodes) and other members are laid out in each of the module regions MR on the optical-component-mounting face. The lands are connected to the bonding wires 3A and a chip-mounting pattern on which the sensor chip 2A is mounted. In order to make FIG. 2 easy to view, the lands are omitted from the figure. Similarly, lands are laid out in each of the module regions MR on the system-component-mounting face. These lands are connected to a chip-mounting pattern, the bonding wires 3B and 3C and electrodes of the chip component 11. This chip-mounting pattern is a pattern on which the logic chip 2B and the memory chip 2C are mounted. In order to make FIG. 3 easy to view, the lands are omitted from the figure. It is to be noted that the connection terminals 15, the chip-mounting patterns and the lands are made of typically copper, which is also used as the wire material cited above. In addition, the surfaces of the connection terminals 15, the chip-mounting patterns and the lands are subjected to a metal-plating process using metals such as nickel (Ni) and gold (Au).

In close proximity to each of the module regions MR, a plurality of through holes 16 each called a boss hole is formed. The through holes 16 are used for adjusting the position of the lens barrel 4 with respect to the wiring substrate mother board 1. To put it in detail, as will be described later, when the lens barrel 4 is joined to the wiring substrate mother board 1, a positioning pin provided on the lens barrel 4 is inserted into the through hole 16 provided on the wiring substrate mother board 1. The positioning pin provided on the lens barrel 4 is referred to as a boss pin. By inserting the positioning pin provided on the lens barrel 4 into the through hole 16 provided on the wiring substrate mother board 1, the lens barrel 4 can be joined to the wiring substrate mother board 1 with the planar position of the lens barrel 4 adjusted with respect to the wiring substrate mother board 1. In this embodiment, a through hole 16 is positioned outside a module region MR. To be more specific, on the optical-component-mounting surface, the through hole 16 is provided at a position outside the bottom of the foot of the lens barrel 4 as will be described later. Also as will be described later, on the system-component-mounting surface, the through hole 16 is provided at a position outside a region in which the encapsulation body 12M is formed. For each of the module regions MR, two through holes 16 are provided. The two through holes 16 are provided at positions, which sandwich the module region MR, being connected to each other by a diagonal line of the module region MR. It is to be noted that, on the inner circumferential face of the through hole 16 and on areas surrounding the opening of the through hole 16 are coated with a conductor material in the same way as a through hole of an ordinary print wiring substrate. The conductor material is the same material as the material for making wires.

A plurality of conductor patterns 17A each having typically a plane rectangular shape is formed in areas in close proximity to the four sides of the optical-component-mounting face and system-component-mounting face of the wiring substrate mother board 1. In addition, a plurality of conductor patterns 17B each having typically a plane rectangular shape is laid out to form an array in an area in close proximity to one side of the system-component-mounting face at predetermined intervals. The conductor patterns 17B are provided as patterns for making resin (used as an encapsulation material), which has been hardened inside a runner, easy to peel off and remove from the wiring substrate mother board 1. Encapsulation groups are divided into groups each associated with a line for which one of the conductor pattern 17B exists. The conductor patterns 17A and 17B are made of typically copper. The surfaces of the conductor patterns 17A and 17B are subjected to a metal-plating process using metals such as nickel (Ni) and gold (Au). In addition, at a location on a diagonal line of the wiring substrate mother board 1, there is formed a through hole 18A used for adjusting the position of the wiring substrate mother board 1 with respect to the manufactured device.

Figure 5:
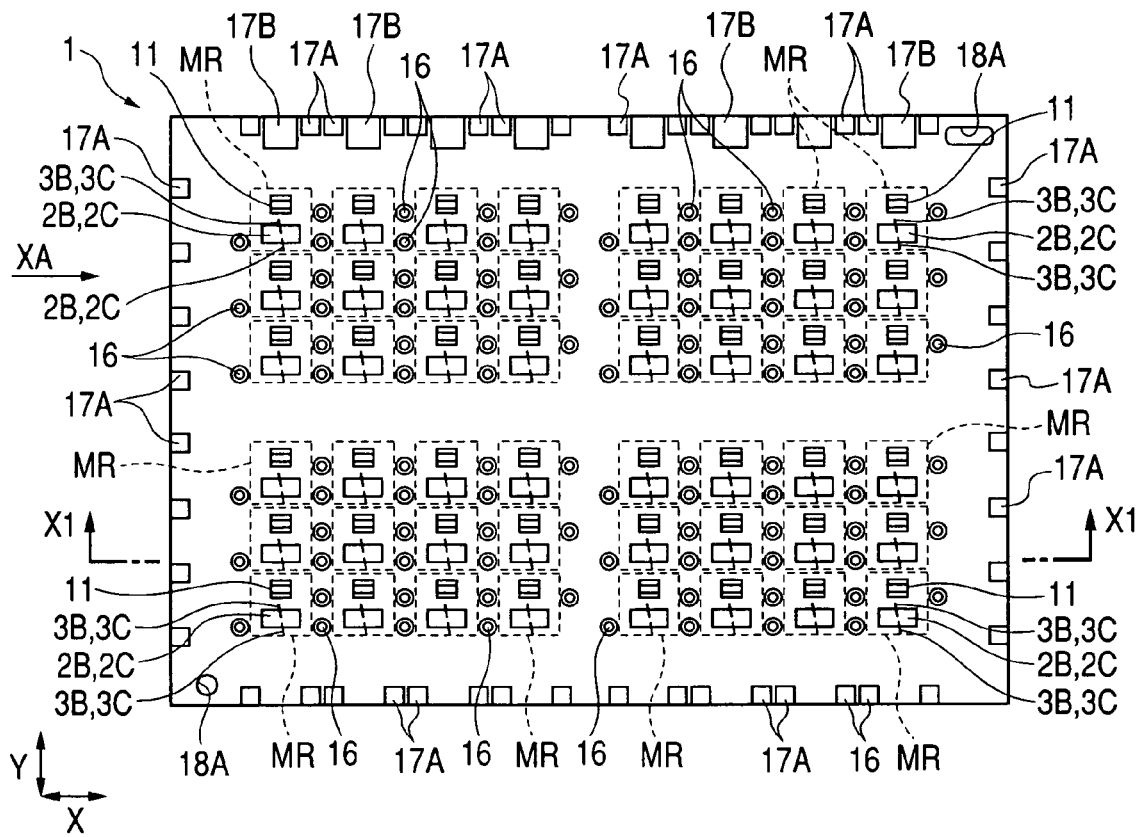
FIG. 5 is a diagram showing an entire top view of electronic components mounted on the first face shown in FIG. 3.
Figure 6:
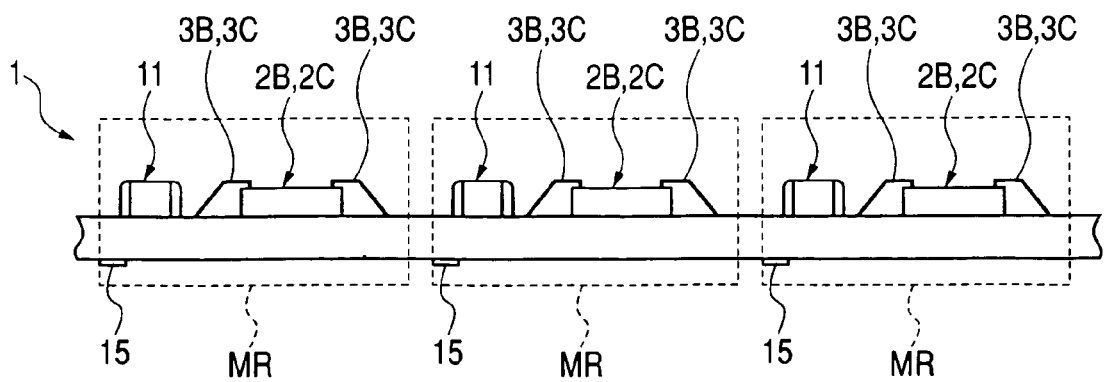
FIG. 6 is a side-view diagram showing main components with the wiring substrate mother board seen in a horizontal direction indicated by an arrow XA shown in FIG. 5.

Then, as shown in FIGS. 5 and 6, in each of the module regions MR on the system-component-mounting area of the wiring substrate mother board 1, the logic chip 2B and the memory chip 2C are mounted after a process of mounting the chip component 11. Subsequently, the logic chip 2B and the memory chip 2C are electrically connected to wires of the wiring substrate mother board 1 in the module region MR by bonding wires 3B and 3C respectively. It is to be noted that FIG. 5 is a diagram showing an entire top view after the chip component 11 is mounted on the face shown in FIG. 3. FIG. 6 is a side-view diagram showing main components with the wiring substrate mother board 1 seen in a horizontal direction indicated by an arrow XA shown in FIG. 5. In order to simplify the diagrams of FIGS. 5 and 6, the logic chip 2B and the memory chip 2C are shown collectively as a single semiconductor chip.

Figure 7:
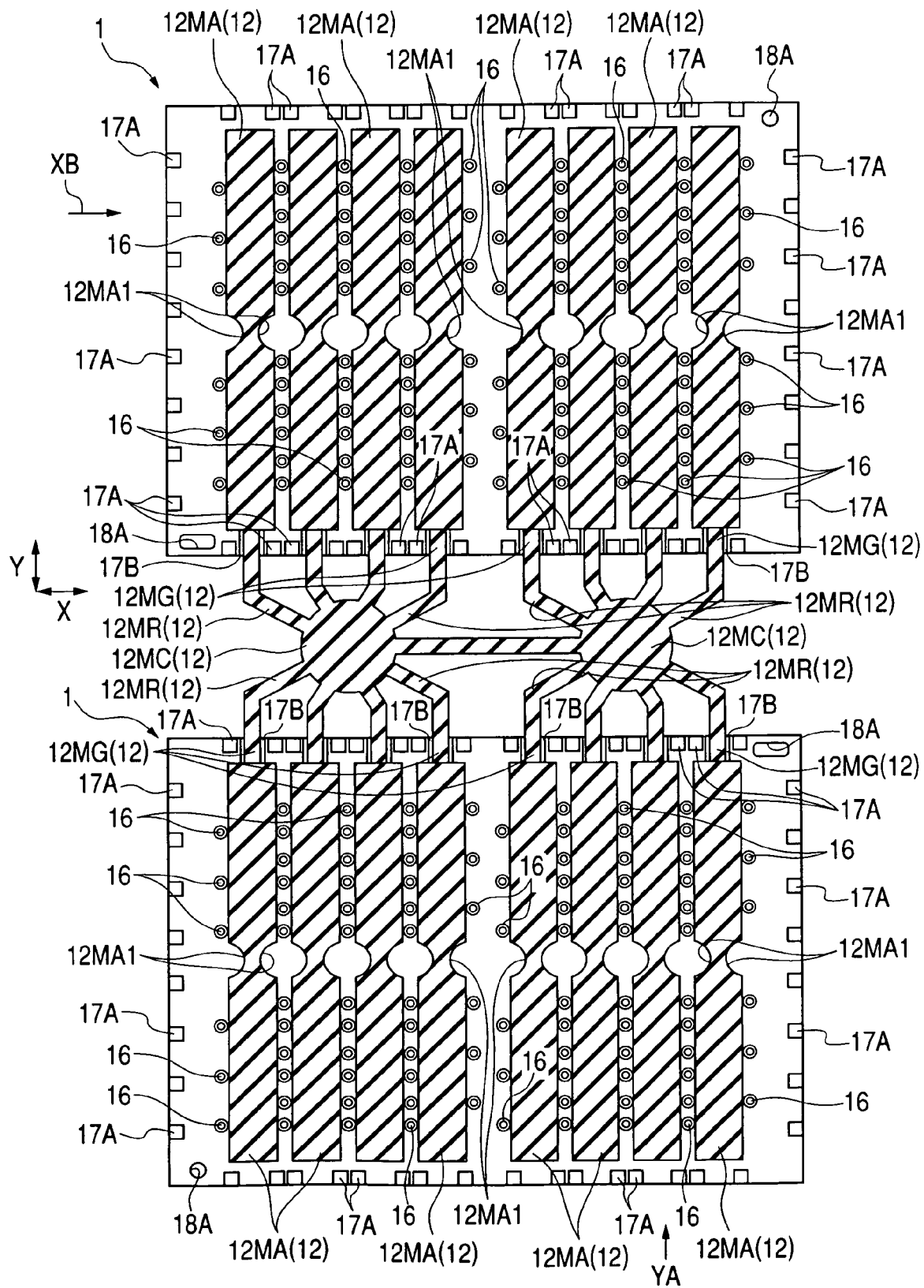
FIG. 7 is a diagram showing a top view of the entire first faces of two wiring substrate mother boards including a state of an encapsulation body right after an encapsulation process following the state shown in FIG. 5.
Figure 8:
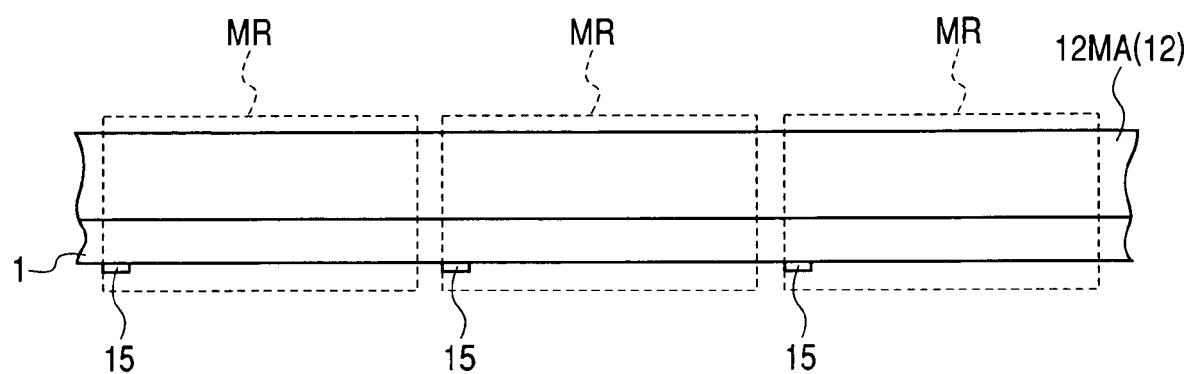
FIG. 8 is a side-view diagram showing main components with the wiring substrate mother board seen in a horizontal direction indicated by an arrow XB shown in FIG. 7.
Figure 9:
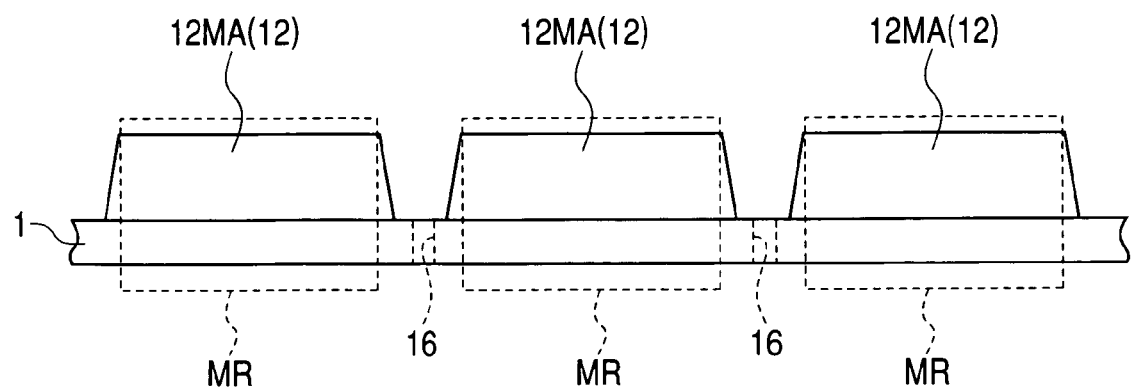
FIG. 9 is a side-view diagram showing main components with the wiring substrate mother board seen in a horizontal direction indicated by an arrow YA shown in FIG. 7.

Then, after the wiring substrate mother board 1 is held by using upper and lower encapsulation metal molds in a state of being sandwiched by the upper and lower encapsulation metal molds in such a way that the logic chip 2B, the memory chip 2C as well as the bonding wires 3B and 3C are placed in a cavity between the upper and lower encapsulation metal molds, the system components including the logic chip 2B, the memory chip 2C and the chip component 11, which are mounted on the system-component-mounting face, are encapsulated by an encapsulation material, which is typically resin having a heat-curing characteristic. An example of such resin is resin of the epoxy group including silica fillers. FIG. 7 is a diagram showing a state of a batch encapsulation body 12MA right after the encapsulation process. FIG. 8 is a side-view diagram showing main components with the wiring substrate mother board 1 seen in a horizontal direction indicated by an arrow XB shown in FIG. 7. FIG. 9 is a side-view diagram showing main components with the wiring substrate mother board 1 seen in a horizontal direction indicated by an arrow YA shown in FIG. 7. It is to be noted that FIG. 7 is a diagram showing a state with the encapsulation molds seen fluoroscopically. In addition, while FIG. 7 shows a top view of a state of a batch encapsulation body 12MA, encapsulation materials 12 are each shown as a hatched block in order to make the diagram easy to inspect. Furthermore, in the diagram of FIG. 7, an encapsulation material 12MC represents a portion corresponding to an encapsulation material inside a cull, an encapsulation material 12MR represents a portion corresponding to an encapsulation material inside a runner and an encapsulation material 12MG represents a portion corresponding to an encapsulation material inside a gate.

As an encapsulation method, there is adopted a batch encapsulation method for encapsulating system components in the module regions MR by handling the components as a lump. In this embodiment, however, the module regions MR of the wiring substrate mother board 1 are divided into a plurality of groups and the batch encapsulation method is applied to each of the groups by handling components in each group as a lump. For this reason, on the system-component-mounting face of the wiring substrate mother board 1, system components of module regions MR laid out in the second direction Y shown in FIG. 7 are subjected to a batch encapsulation process by using the batch encapsulation bodies 12MA. In the first direction X shown in FIG. 7, however, the batch encapsulation bodies 12MA are separated from each other in order to prevent the through holes 16 for position adjustment from being covered by the batch encapsulation bodies 12MA. In such an encapsulation process, an encapsulation material 12 injected from a cull is split into a plurality of runners (each serving as an encapsulation-material-supplying passage) and gates (each serving as an encapsulation-material-supplying passage) for each of the groups. The encapsulation material 12 is then injected into a cavity for forming an encapsulation body in each of the groups via each runner and gate.

A typical reason why the batch encapsulation bodies 12MA are each provided at a location not superposed on through holes 16 is explained as follows. If a batch encapsulation body 12MA is superposed on a through hole 16, the encapsulation material 12 inevitably flows out from the system-component-mounting face to the optical-component-mounting face through the through hole 16 in the course of an encapsulation process. Thus, in areas surrounding the opening of the through hole 16 on the optical-component-mounting face, resin fins, resin flashes and the like are formed, and the through hole 16 is blocked up by the encapsulation material 12. If the lens barrel 4 is mounted on the optical-component-mounting face in this state, the adhesiveness and state of adhesion between the lens barrel 4 and the optical-component-mounting face deteriorate, forming a small gap between the lens barrel 4 and the optical-component-mounting face. As a result, in subsequent manufacturing processes, foreign matters are injected into the lens barrel 4 by way of the gap and stuck on the sensor array of the sensor chip 2A, much increasing a rate of generation of black-point defects. A high rate of generation of black-point defects raises a problem that the yield of the camera module is lowered to an extremely small value. In order to avoid this problem, there is conceived a solution to temporarily fill up the through hole 16 with a material prior to the encapsulation process. However, this solution raises another problem that it is difficult to select a suitable material with which the through hole 16 is to be temporarily filled up and, even if the through hole 16 is filled up with such a material, the temporary filler material will be pushed out from the hole 16 by a resin injection pressure of the encapsulation material 12 applied in the encapsulation process. In the embodiment, on the other hand, the batch encapsulation bodies 12MA are separated from each other in order to prevent the through holes 16 from being covered by the batch encapsulation bodies 12MA. It is thus possible to solve the problem that the encapsulation material 12 inevitably flows out from the system-component-mounting face to the optical-component-mounting face through the through hole 16 in the course of an encapsulation process. As a result, since the lens barrel 4 can be well stuck on the optical-component-mounting face without forming a gap, it is possible to reduce the quantity of foreign matters flowing into the lens barrel 4 by way of a gap formed between the lens barrel 4 and the optical-component-mounting face or even possible to completely prevent the foreign matters from flowing into the lens barrel 4 by way of the gap formed between the lens barrel 4 and the optical-component-mounting face. Thus, since the rate of generation of black-point defects caused by introduction of foreign matters can be reduced, the yield of the camera module CM can be increased. In addition, since cumbersome works such as selection of a material with which the through hole 16 is to be temporarily filled up and the process to fill up the through hole 16 with the selected material are not required, it is possible to simplify the process of manufacturing the camera module CM and to shorten the manufacturing time.

Figure 10:
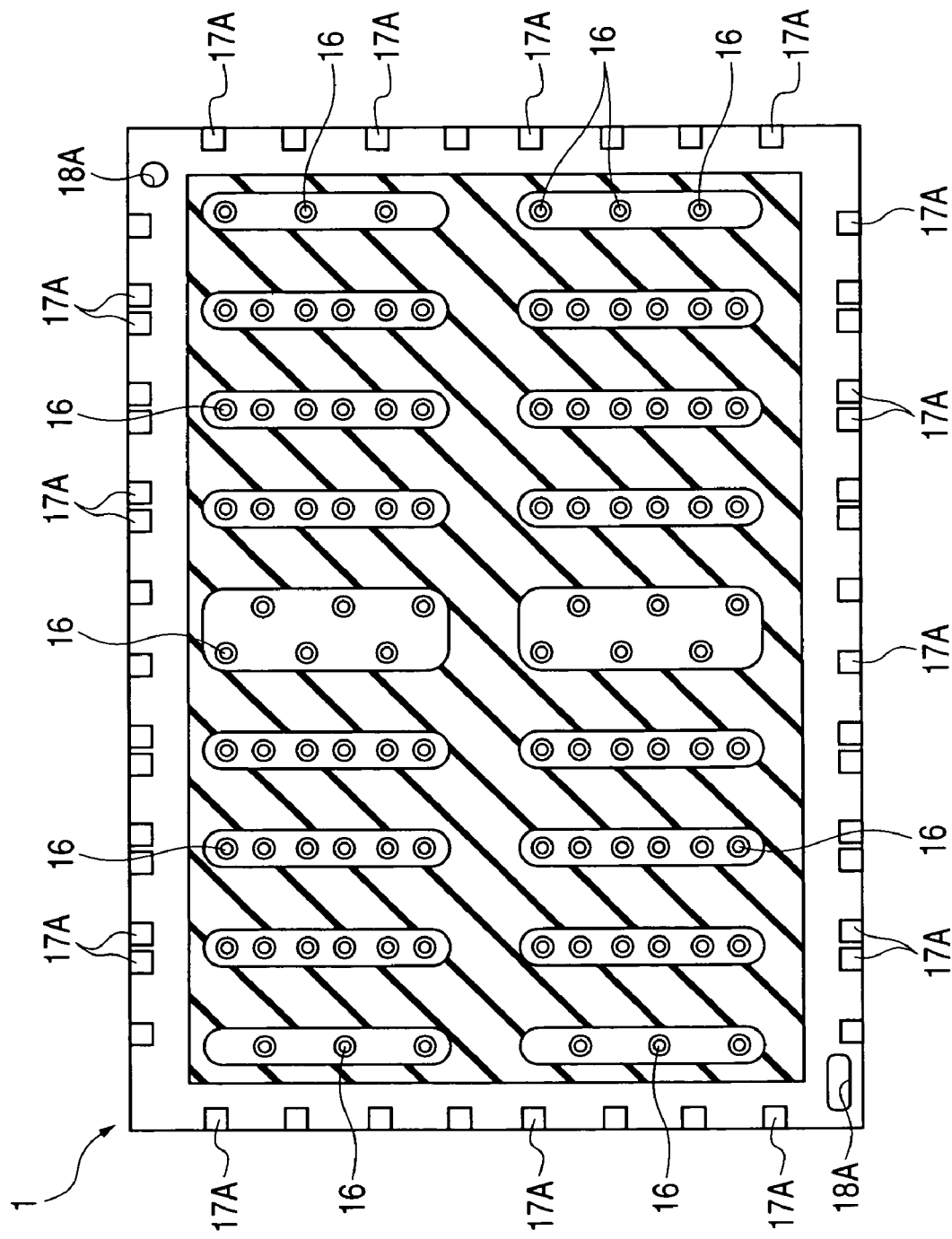
FIG. 10 is a diagram showing an entire top view after a batch process in another embodiment of the present invention.

In addition, it is possible to provide a configuration like one shown in FIG. 10. In this configuration, the batch encapsulation bodies 12MA are separated from each other in order to prevent the through holes 16 from being covered by the batch encapsulation bodies 12MA. By providing such a configuration, problems related to the through hole 16 can be solved. However, if a batch encapsulation process is carried out in a way suggested by the one shown in FIG. 10, the shrinkage of the batch encapsulation body 12MA applies a stress to the wiring substrate mother board 1, inadvertently bending the wiring substrate mother board 1 in some cases. In order to solve this problem, in the embodiment shown in FIG. 7, the individual batch encapsulation bodies 12MA are separated from each other. By separating the individual batch encapsulation bodies 12MA from each other, it is possible to reduce the magnitude of the stress applied to the wiring substrate mother board 1 due to the shrinkages of the individual batch encapsulation bodies 12MA to a value smaller than the magnitude of a stress applied in a batch encapsulation process carried out on system components of all module regions MR on the system-component-mounting face of the wiring substrate mother board 1. It is thus possible to reduce the amount of bending, twist, etc. resulting in the wiring substrate mother board 1 due to the stress. If bending, twist or the like exists in the wiring substrate mother board 1, in a junction process of bonding wires 3A after a process to mount the sensor chip 2A on the optical-component-mounting face of the wiring substrate mother board 1, the bonding wires 3A may not be joined well in some cases. On the other hand, the batch encapsulation bodies 12MA are separated from each other in this embodiment. It is thus possible to reduce the amount of bending, twist, etc. As a result, the bondability of the bond wires 3A can be improved so that the yield of the camera module CM can also be increased as well.

Figure 11:
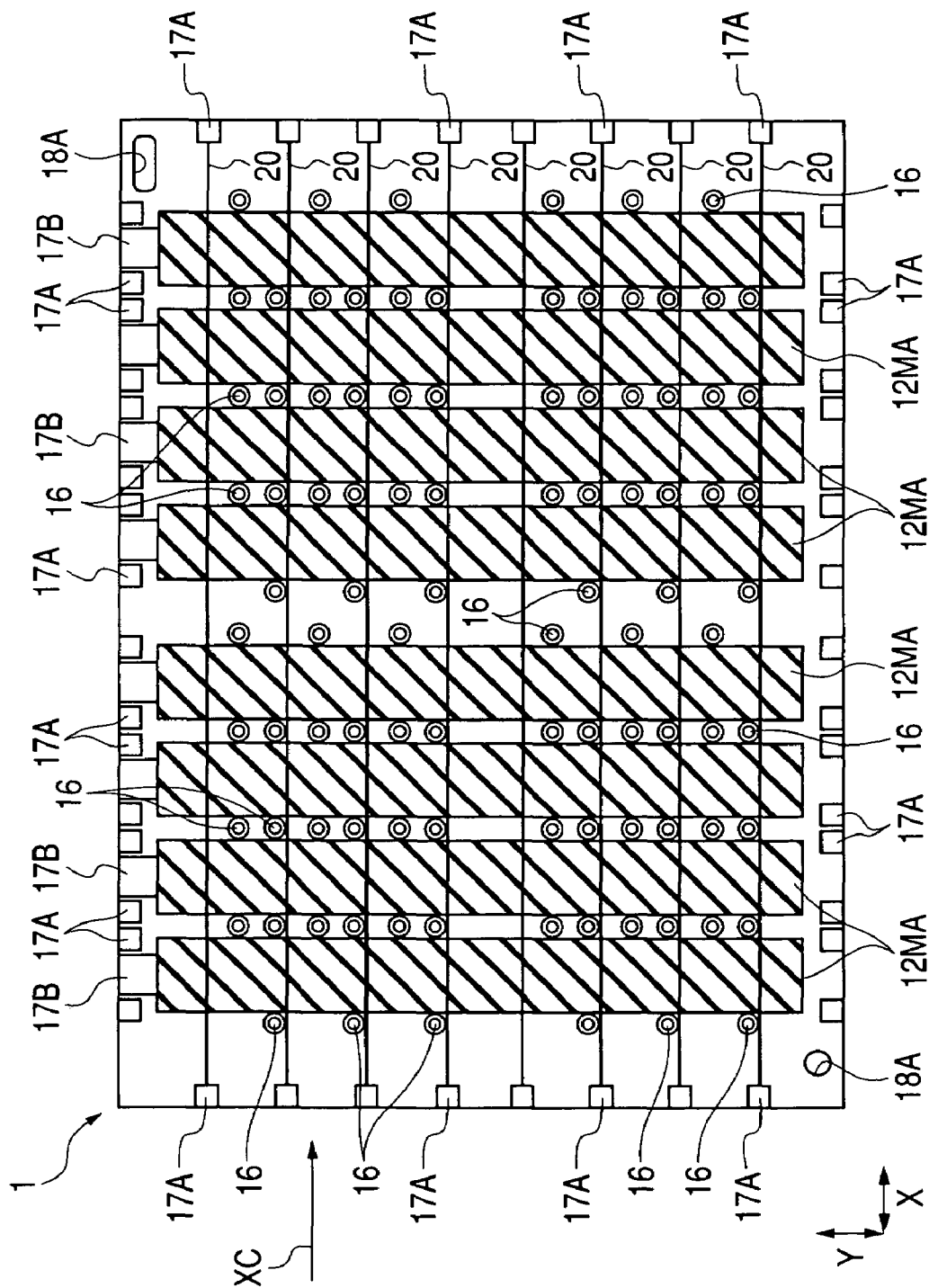
FIG. 11 is a diagram showing an entire top view after a batch process in a further embodiment of the present invention.

In addition, it is also possible to provide a configuration for separating the batch encapsulation bodies 12MA from each other like one shown in FIG. 11. In this case, it is possible to solve problems related to through hole 16 and also reduce the magnitude of the stress. However, when the magnitude of the stress may not be reduced sufficiently even in the configuration shown in FIG. 11, the wiring substrate mother board 1 is bent toward the center of the longitudinal direction of batch encapsulation bodies 12MA. In order to solve this problem, in this embodiment, a depression 12MA1 extended from both the long sides of the batch encapsulation body 12MA to the transversal-direction center of the batch encapsulation body 12MA is further formed so that the width of the longitudinal-direction center of each batch encapsulation body 12MA becomes partially smaller. The depressions 12MA1 are formed on the right and left long sides of a batch encapsulation body 12MA symmetrically in the left-to-right direction with respect to the right and left long sides. In addition, each depression 12MA1 is formed in a surplus area outside a module region MR. In this embodiment, by reducing the width of the longitudinal-direction center of each batch encapsulation body 12MA as described above, the magnitude of the stress applied to the wiring substrate mother board 1 due to the shrinkage of each batch encapsulation body 12MA can be further decreased. Thus, the amount of bending, twist, etc. resulting in the wiring substrate mother board 1 due to the stress can be further reduced too. Accordingly, the bondability of each bonding wire 3A can be further improved. As a result, the yield of the camera module CM can be further increased. However, the position of the depression 12MA1 is not limited to the longitudinal-direction center of the batch encapsulation body 12MA. For example, a plurality of depressions 12MA1 can be formed at a plurality of positions on the right and left long sides of a batch encapsulation body 12MA.

Figure 12:
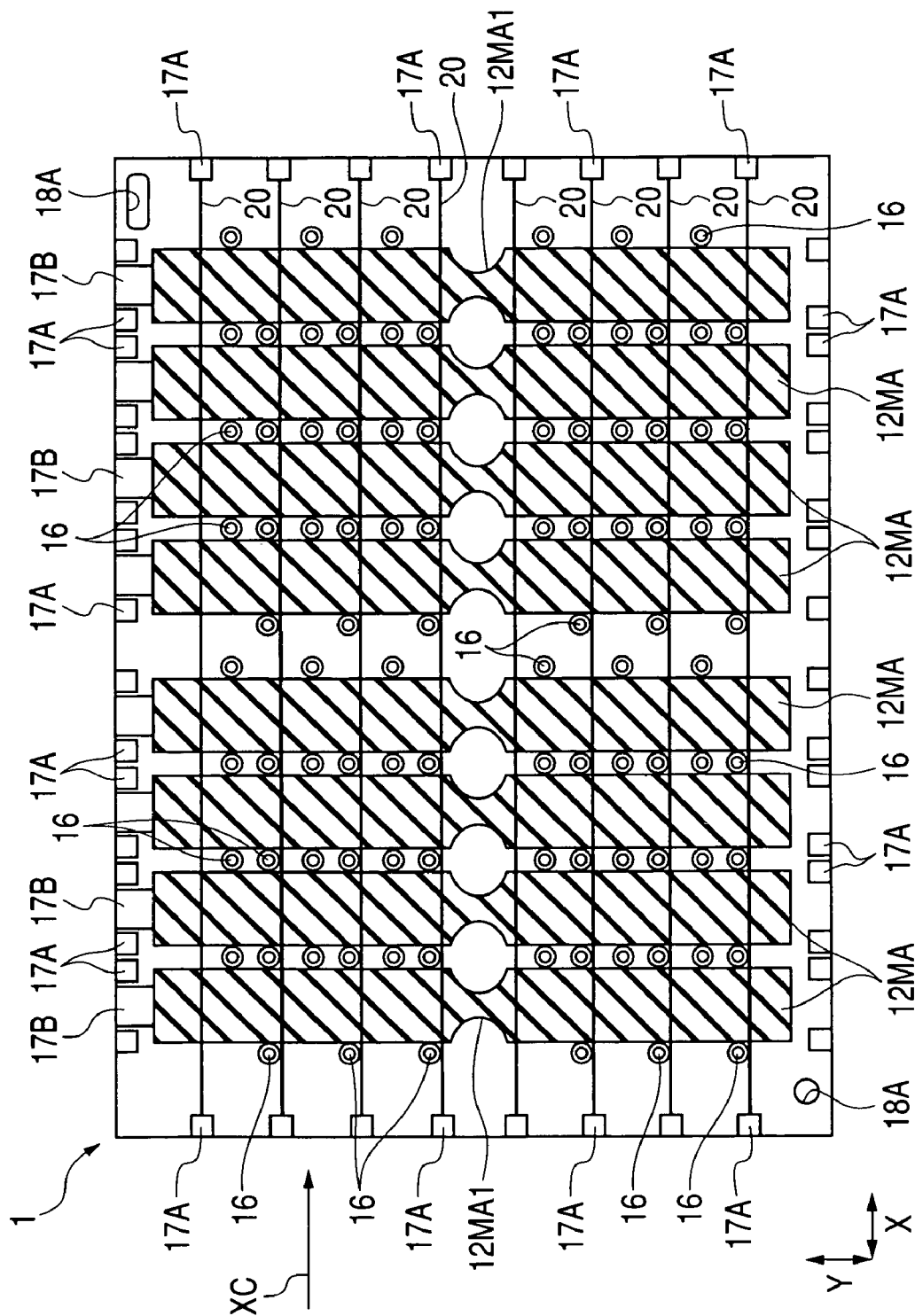
FIG. 12 is a diagram showing a top view of the entire first face of the wiring substrate mother board after a process following the state shown in FIG. 7.
Figure 13:
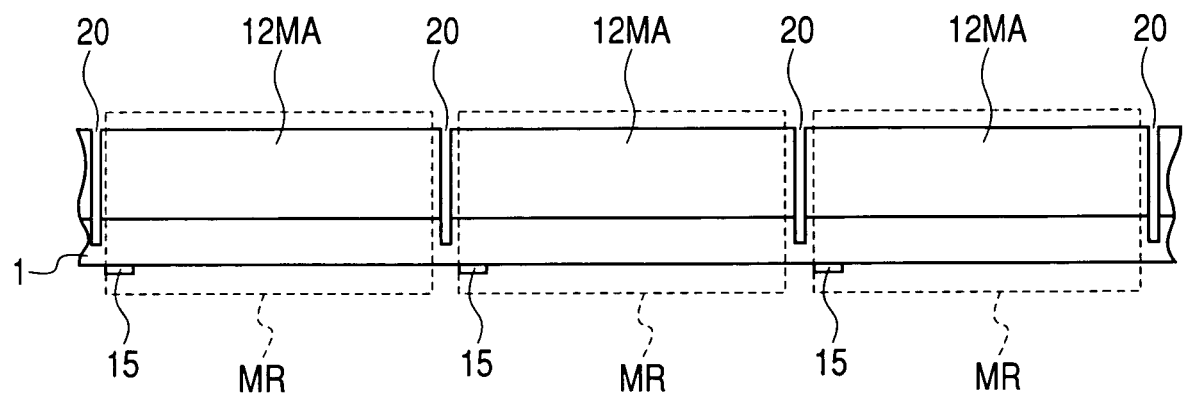
FIG. 13 is a side-view diagram showing main components with the wiring substrate mother board seen in a horizontal direction indicated by an arrow XC shown in FIG. 12.

Then, a half-dicing process is carried out on the wiring substrate mother board 1 as shown in FIGS. 12 and 13 to split a batch encapsulation body 12MA into portions located on different module regions MR. FIG. 12 is a diagram showing a top view of the entire system-component-mounting face of the wiring substrate mother board 1 after the half-dicing process. FIG. 13 is a side-view diagram showing main components with the wiring substrate mother board 1 seen in a horizontal direction indicated by an arrow XC shown in FIG. 12. The half-dicing process is carried out, being started from the system-component-mounting face on which the encapsulation bodies 12A have been formed. A plurality of straight-line cut grooves 20 extended in the first direction X is formed, with the straight-line cut grooves 20 being separated from each other by predetermined intervals in the second direction Y on the system-component-mounting face of the wiring substrate mother board 1. The cut grooves 20 are formed by using a dicing saw. The cut grooves 20 completely split the batch encapsulation body 12MA into a plurality of completely separated portions located in the same plurality of module regions MR laid out in the second Y direction. Since the depth of each cut groove 20 is only about ⅔ the depth of the wiring substrate mother board 1, however, the wiring substrate mother board 1 itself is not completely split. By splitting the batch encapsulation body 12MA into portions separated from each other by the cut grooves 20 as described above, the magnitude of the stress applied to the wiring substrate mother board 1 due to the shrinkage of the batch encapsulation body 12MA can be further decreased. Thus, bending and twist of the wiring substrate mother board 1 due to the stress are further reduced, whereby the bondability of each bonding wire 3A can be further improved. As a result, the yield of the camera module CM can be further increased.

Even though a cut groove 20 completely splits a batch encapsulation body 12MA into 2 completely separated portions, however, the depth of the cut groove 20 does not have to reach the system-component-mounting face of the wiring substrate mother board 1. Even if the depth of the cut groove 20 does not reach the system-component-mounting face of the wiring substrate mother board 1, the magnitude of the stress applied to the wiring substrate mother board 1 due to the shrinkage of the batch encapsulation body 12MA can be decreased. In addition, the depth of each cut groove 20 can be set at about half the depth of the batch encapsulation body 12MA so that the batch encapsulation body 12MA is not completely split into 2 separated portions. Even in this case, the magnitude of the stress applied to the wiring substrate mother board 1 due to the shrinkage of the batch encapsulation body 12MA can be decreased.

Figure 14:
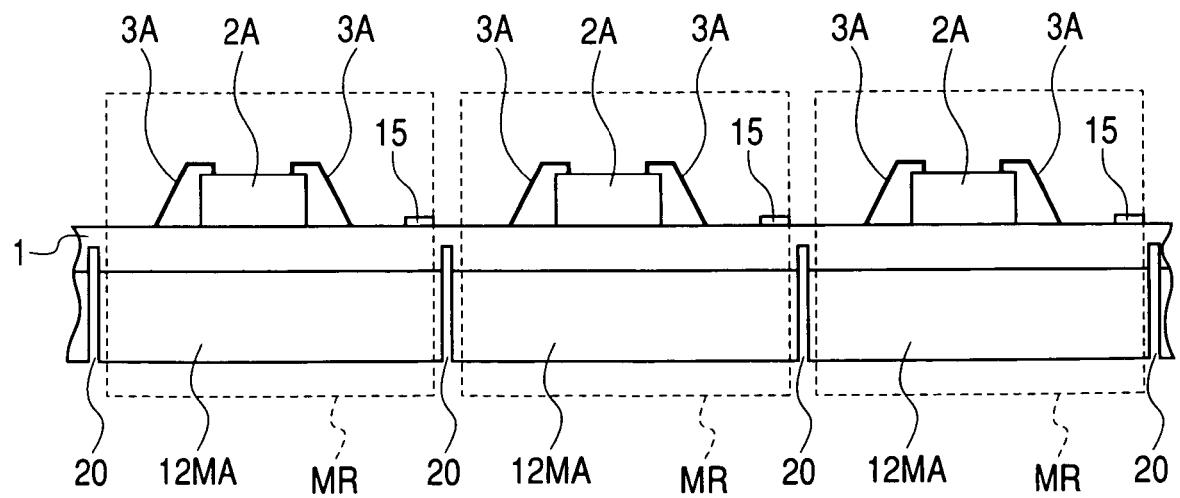
FIG. 14 is a side-view diagram showing main components of the wiring substrate mother board after a manufacturing process following the state shown in FIG. 12.

Then, after a sensor chip 2A is mounted on each module region MR of the optical-component-mounting face of the wiring substrate mother board 1 with the principal face (that is, the light reception face or a light reception device creation face) of the sensor chip 2A oriented upward as shown in FIG. 14, each sensor chip 2A and wires of the module region MR of the wiring substrate mother board 1 are electrically connected to each other by using bonding wires 3A. At that time, in this embodiment, a wire-bonding process can be carried out at an extremely small amount of bending, twist, etc resulting on the wiring substrate mother board 1. Accordingly, the bondability of each bonding wire 3A can be improved. It is to be noted that FIG. 14 is a side-view diagram showing main components in each module region MR of the wiring substrate mother board 1 after the wire-bonding process.

Figure 15:
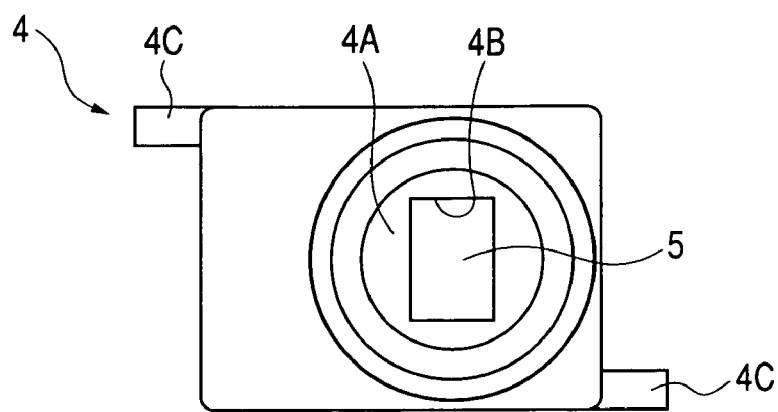
FIG. 15 is a diagram showing a top view seen from the upper face of a lens barrel.
Figure 16:
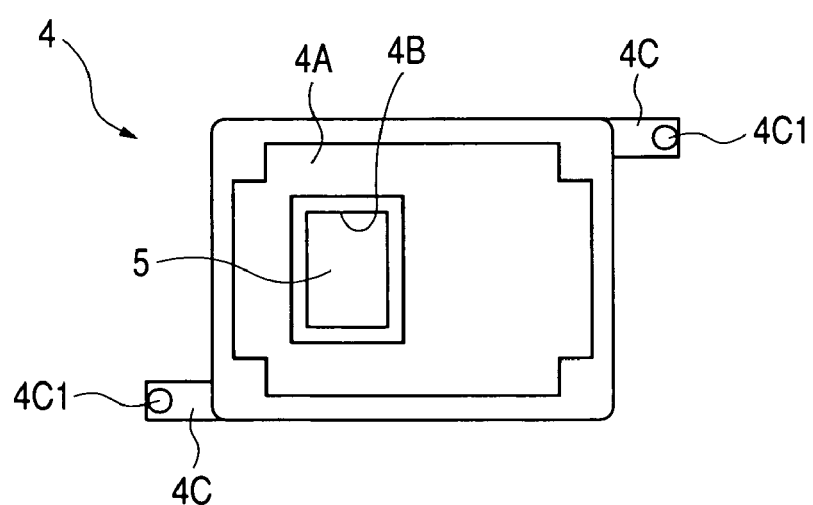
FIG. 16 is a diagram showing a top view of the rear face of the lens barrel shown in FIG. 15.
Figure 17:
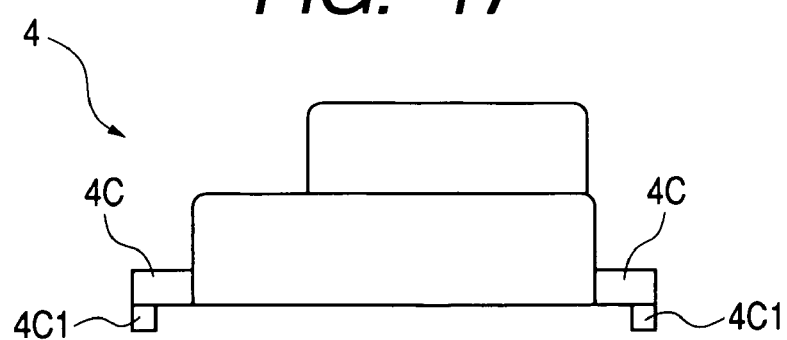
FIG. 17 is a diagram showing a side view of the lens barrel shown in FIG. 15.

Then, a lens barrel 4 like one shown in FIGS. 15 to 17 is prepared. FIG. 15 is a diagram showing a top view of the upper face of the lens barrel 4. FIG. 16 is a diagram showing a top view of the rear face of the lens barrel 4. FIG. 17 is a diagram showing a side view of the lens barrel 4. An IR filter 5 has already been installed in the cylinder of the lens barrel 4. The lens barrel 4 has protrusions 4C, which are formed, being integrated with the lens barrel 4. The protrusions 4C are each extended all but horizontally on the optical-component-mounting face of the wiring substrate mother board 1. In the top views shown in FIGS. 15 and 16, the protrusions 4C are provided at two corners at the ends of a diagonal line of the lens barrel 4. In the side view shown in FIG. 17, the protrusions 4C are provided at the foot of the lens barrel 4. The protrusions 4C are members used for adjusting the planar position of the lens barrel 4 with respect to the wiring substrate mother board 1. At a back surface of each of the protrusions 4C, a position adjustment pin 4C1 referred to as a boss pin is formed. The position adjustment pin 4C1 is extended vertically with respect to the optical-component-mounting face of the wiring substrate mother board 1.

Figure 18:
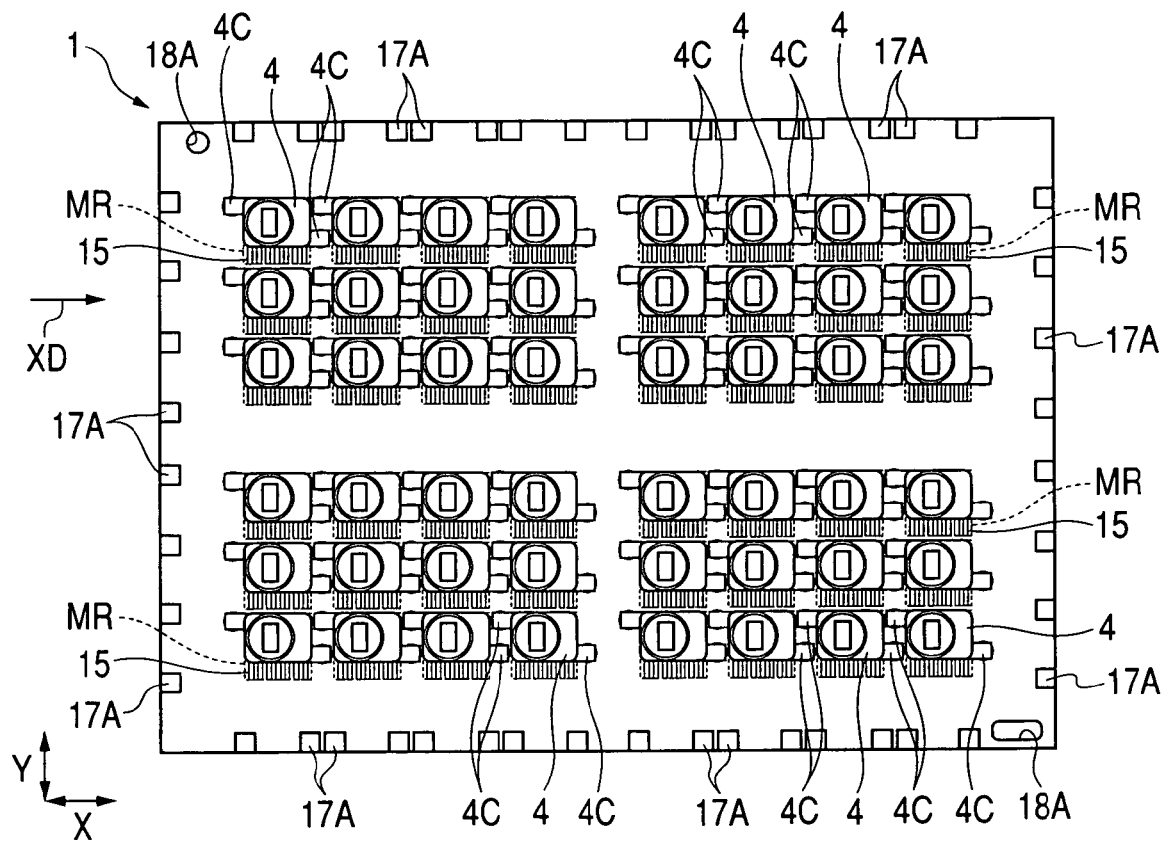
FIG. 18 is a diagram showing a top view of the entire second face of the wiring substrate mother board after a process to mount a lens barrel.
Figure 19:
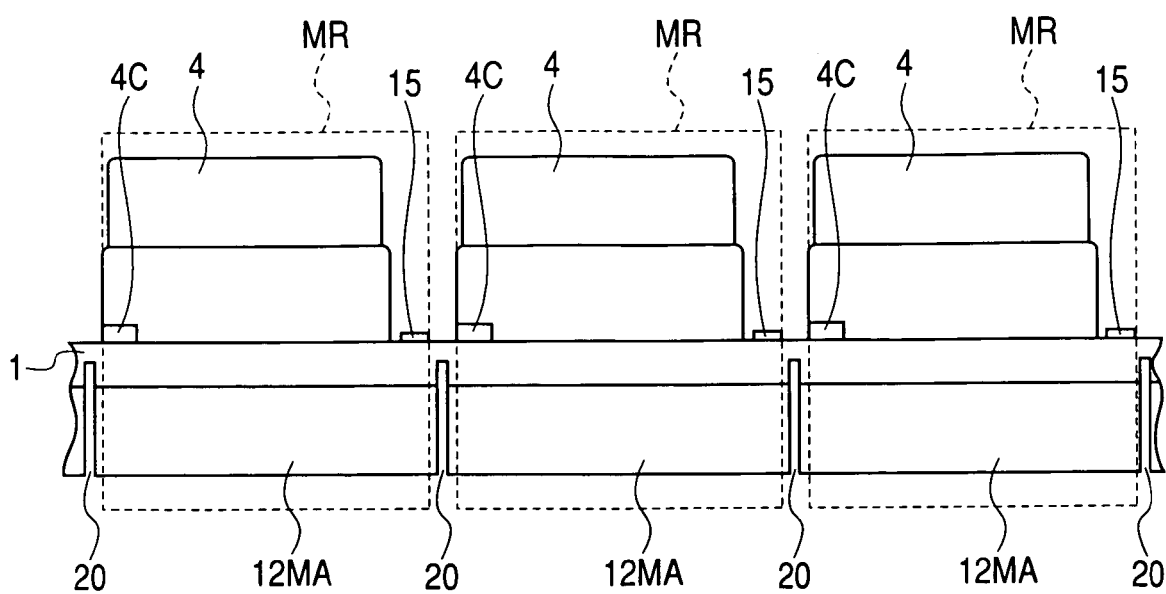
FIG. 19 is a side-view diagram showing main components with the wiring substrate mother board seen in a horizontal direction indicated by an arrow XD shown in FIG. 18.
Figure 20:
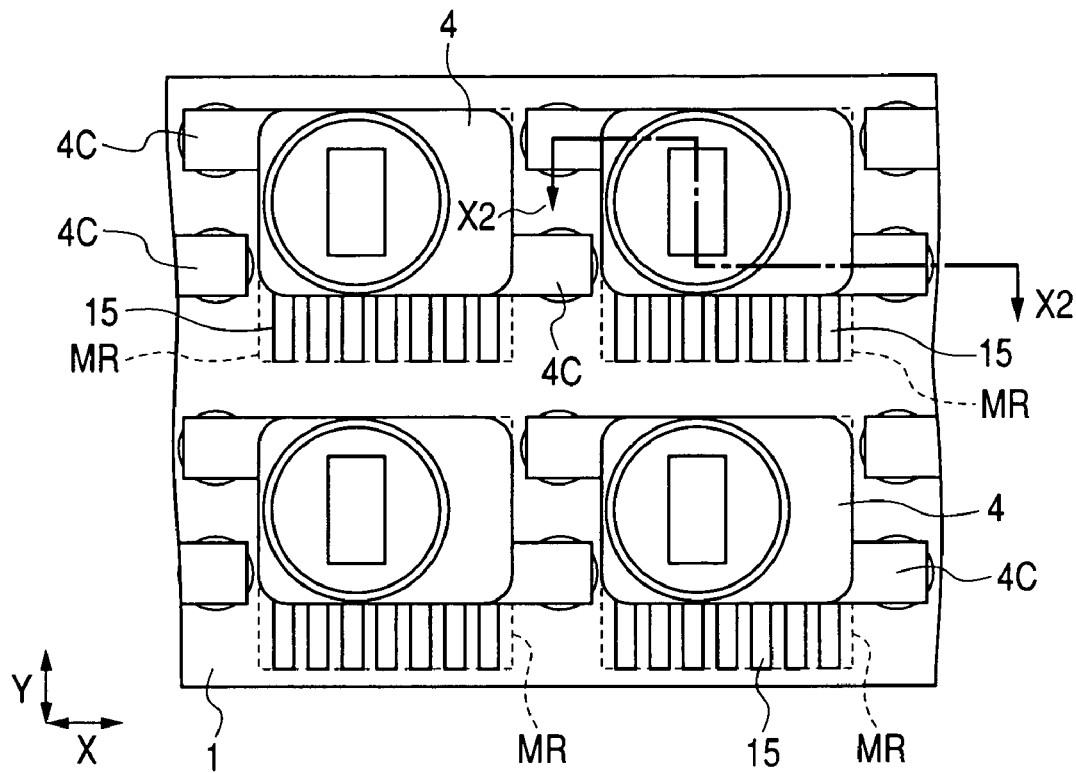
FIG. 20 is an enlarged diagram showing main components of the wiring substrate mother board shown in FIG. 18.
Figure 21:
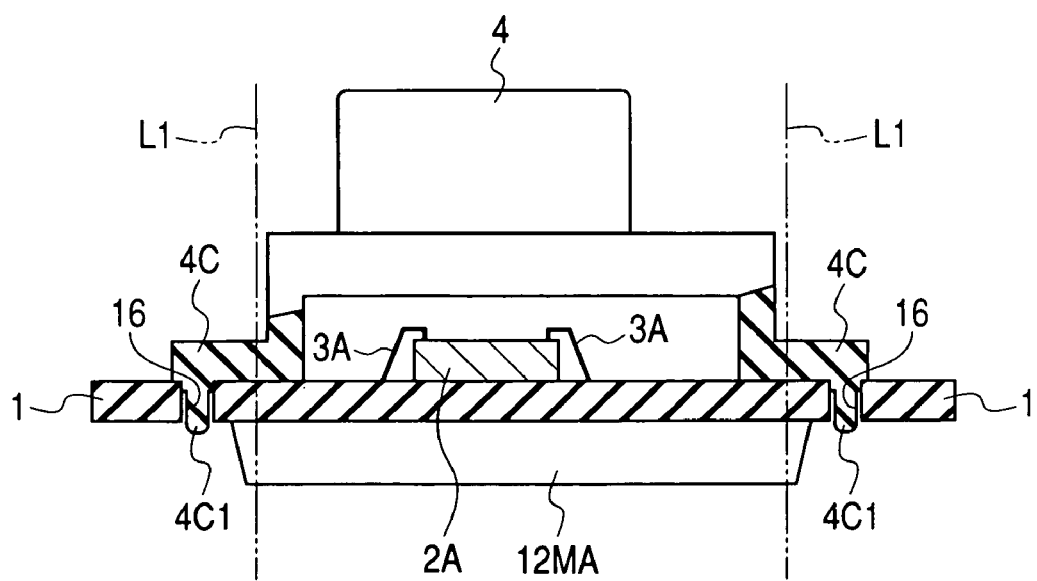
FIG. 21 is a diagram partially showing a cross section at a position on an X2—X2 line shown in FIG. 20.

Then, a plurality of lens barrels 4 is joined to the optical-component-mounting face of the wiring substrate mother board 1 with each of the lens barrel 4 covering a sensor chip 2A as shown in FIGS. 18 to 21. FIG. 18 is a diagram showing a top view of the entire optical-component-mounting face of the wiring substrate mother board 1 after this lens-barrel-mounting process. FIG. 19 is a side-view diagram showing main components with the wiring substrate mother board 1 seen in a horizontal direction indicated by an arrow XD shown in FIG. 18. FIG. 20 is an enlarged diagram showing main components of the wiring substrate mother board 1 shown in FIG. 18. FIG. 21 is a diagram partially showing a partially ruptured cross section at a position on an X2—X2 line shown in FIG. 20. It is to be noted that 2-dotted-dashed lines L1 shown in FIG. 21 are each a dicing line along which the camera module is cut out by cutting the wiring substrate mother board 1 in a later process.

In each module region MR on the optical-component-mounting face of the wiring substrate mother board 1, a plurality of lens barrel 4 is mounted at a uniform orientation. The position of each of the lens barrels 4 is well adjusted with respect to the wiring substrate mother board 1 by inserting the position adjustment pin 4C1 of the protrusion 4C of the lens barrel 4 into a through hole 16 on the wiring substrate mother board 1. In this embodiment, no resin fins, resin flashes and the like are formed in areas surrounding the opening of the through hole 16 as described above. In addition, there is no case in which the through hole 16 is filled up with the encapsulation material 12. Accordingly, the entire rear face of the lens barrel 4 can be stuck substantially on the optical-component-mounting face of the wiring substrate mother board 1 without forming a gap. It is thus possible to reduce the quantity of foreign matters flowing into the lens barrel 4 or even possible to prevent the foreign matters from flowing into the lens barrel 4. As a result, since the rate of generation of black-point defects caused by introduction of foreign matters can be reduced, the yield of the camera module CM can be increased.

In addition, in this embodiment, the position adjustment pin 4C1 of the lens barrel 4 is provided at a position outside the adhesion face of the rear face of the lens barrel 4. The adhesion face is a face stuck to the wiring substrate mother board 1. The position adjustment pin 4C1 of the lens barrel 4 is provided at a position outside the adhesion face because, if the position adjustment pin 4C1 of the lens barrel 4 is provided on the adhesion face of the rear face of the lens barrel 4, the position adjustment pin 4C1 will serve as an obstacle to a process to coat the rear face of the lens barrel 4 with a bonding agent so that the rear face of the lens barrel 4 cannot be coated well with the bonding agent. Thus, a small gap is formed between the lens barrel 4 and the wiring substrate mother board 1 due to an adhesion defect and, accordingly, foreign matters generated in the course of a later process enter the inside of the lens barrel 4 by way of the gap, causing an optical defect such as a black-point defect to be generated. As a result, the yield of the camera module decreases to an extremely low value in some cases. On the other hand, the position adjustment pin 4C1 of the lens barrel 4 is provided at a position outside the adhesion face of the rear face of the lens barrel 4 in this embodiment. Thus, since the position adjustment pin 4C1 of the lens barrel 4 does not exist on the adhesion face of the rear face of the lens barrel 4, the adhesion face of the rear face of the lens barrel 4 can be made flat. As a result, since the entire adhesion face of the rear face of the lens barrel 4 can be coated with an adhesion agent uniformly, the entire adhesion face of the rear face of the lens barrel 4 can be stuck substantially on the optical-component-mounting face of the wiring substrate mother board 1 without generating a gap. Accordingly, since the rate of generation of black-point defects caused by introduction of foreign matters into the lens barrel 4 can be reduced, the yield of the camera module CM can be increased.

Consider lens barrels 4 arranged in the first direction X of FIG. 18 at positions adjacent to each other. In this embodiment, the protrusions 4C of any specific lens barrel 4 are provided at locations separated away from the locations of the protrusions 4C of a lens barrel 4 adjacent to the specific lens barrel 4 so that the protrusions 4C of the specific lens barrel 4 and the protrusions 4C of the adjacent lens barrel 4 do not mutually interfere with each other. For this reason, the lens barrels 4 arranged in the first direction X at positions adjacent to each other can be provided at squeezed intervals. Thus, the area of the wiring substrate mother board 1 does not increase only because protrusions 4C are provided on each lens barrel 4. As a result, the material cost does not increase and it is therefore possible to suppress the manufacturing cost of the camera module CM at a low level.

In addition, in this embodiment, a protrusion 4C is provided at a corner at one end of a diagonal line of a lens barrel 4 and another protrusion 4C is provided at another corner at the other end of the diagonal line. Thus, it is possible to improve the stability in sticking the lens barrel 4 on the optical-component-mounting face of the wiring substrate mother board 1. Furthermore, if a protrusion 4C is provided at a corner at one end of a diagonal line of a lens barrel 4 and another protrusion 4C is provided at another corner at the other end of the diagonal line as described above, the cutoff quantity of a protrusion 4C (that is, the width of each protrusion 4C to be cut in a later process to cut off the wiring substrate mother board 1 can be reduced to a value smaller than a configuration in which 2 protrusions 4C protrude off from one side of a lens barrel 4. It is thus possible to reduce the magnitude of a force applied to the lens barrel 4 in the cutoff process.

It is to be noted that the number of protrusions 4C per lens barrel 4 is not limited to two. Instead, the number of protrusions 4C per lens barrel 4 can be changed to any value. For example, the number of protrusions 4C per lens barrel 4 can be set at one or three. In addition, it is also possible to provide a configuration in which two protrusions 4C protrude off from one side of a lens barrel 4.

Figure 22:
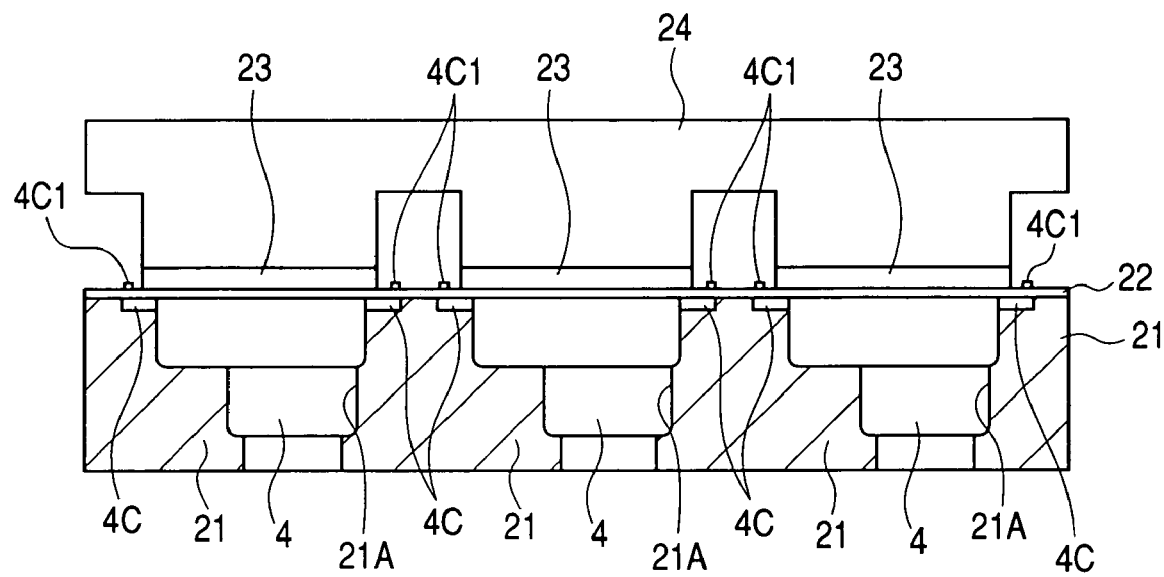
FIG. 22 is an explanatory diagram showing a process of bonding lens barrels.
Figure 23:
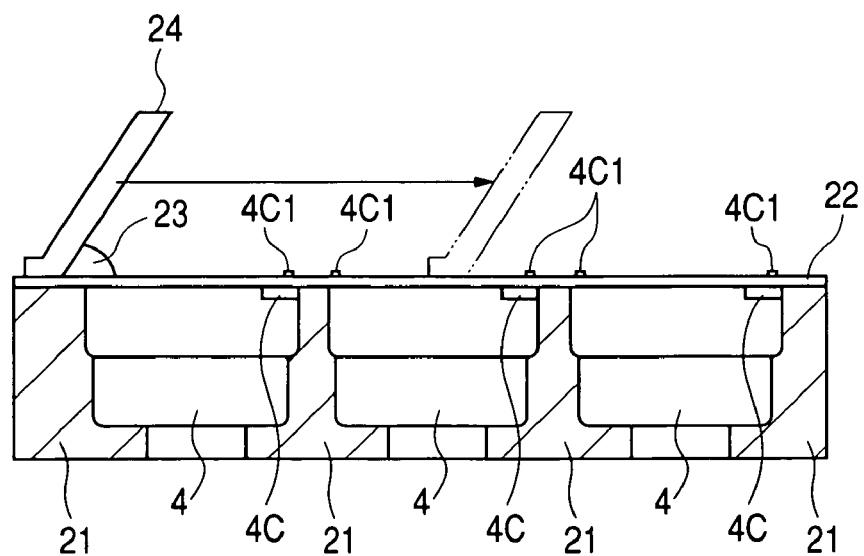
FIG. 23 is an explanatory diagram showing a process of bonding lens barrels when seeing FIG. 22 in a side-face direction.

The following description explains a typical method of joining lens barrels 4 to the wiring substrate mother board 1. FIG. 22 is an explanatory diagram showing a process of bonding lens barrels 4. FIG. 23 is an explanatory diagram showing a process of bonding lens barrels 4 when seeing FIG. 22 in a side-face direction. A lens-barrel jig 21 used in the process of bonding lens barrels 4 has a plurality of support depressions 21A. First of all, a lens barrel 4 is accommodated in each of the support depressions 21A with the rear face of the lens barrel 4 oriented upward. Then, the accommodated lens barrel 4 is fixed temporarily by vacuum suction. Subsequently, after a metallic mask 22 is mounted on the upper face of the lens-barrel jig 21, the upper face of the metallic mask 22 is coated with a bonding agent 23 having a predetermined quantity. The bonding agent 23 is dispersed by a movement of a squeegee 24. In this way, the bonding agent 23 is dispersed over a plurality of lens barrels 4 through the metallic mask 22 in a single operation, being selectively applied to the adhesion face on the rear face of each of the lens barrels 4. As described above, in the case of the embodiment, the position adjustment pins 4C1 of each lens barrel 4 are each provided at a position outside the adhesion face of the rear face of the lens barrel 4 and, thus, do not exist on the adhesion face of the rear face of the lens barrel 4. Accordingly, the entire rear face of the lens barrel 4 can be coated with the adhesion agent 23 uniformly. The position adjustment pins 4C1 of the lens barrel 4 protrude off by way of through holes formed on the metallic mask 22 from the upper face of the metallic mask 22 by a distance of the order of 1 mm. In the process of coating the rear face of each lens barrel 4 with bonding agent 23, however, the position adjustment pins 4C1 are prevented from being coated with the bonding agent 23. This is because, if the position adjustment pins 4C1 are coated with the bonding agent 23, the bonding agent 23 will flow into the inside of the lens barrel 4 through the through holes of the metallic mask 22, raising a problem that the lens-barrel jig 21 and the lens barrel 4 are bonded to each other by the bonding agent 23 in some cases. In order to solve this problem, in this embodiment, a squeegee resembling comb teeth as shown in FIG. 22 is used as the squeegee 24 so that the teeth of the squeegee 24 do not hit the position adjustment pins 4C1, that is, the position adjustment pins 4C1 are not coated with the bonding agent 23. In this way, it is possible to solve the problem that the lens-barrel jig 21 and the lens barrel 4 are bonded to each other by the bonding agent 23.

Figure 24:
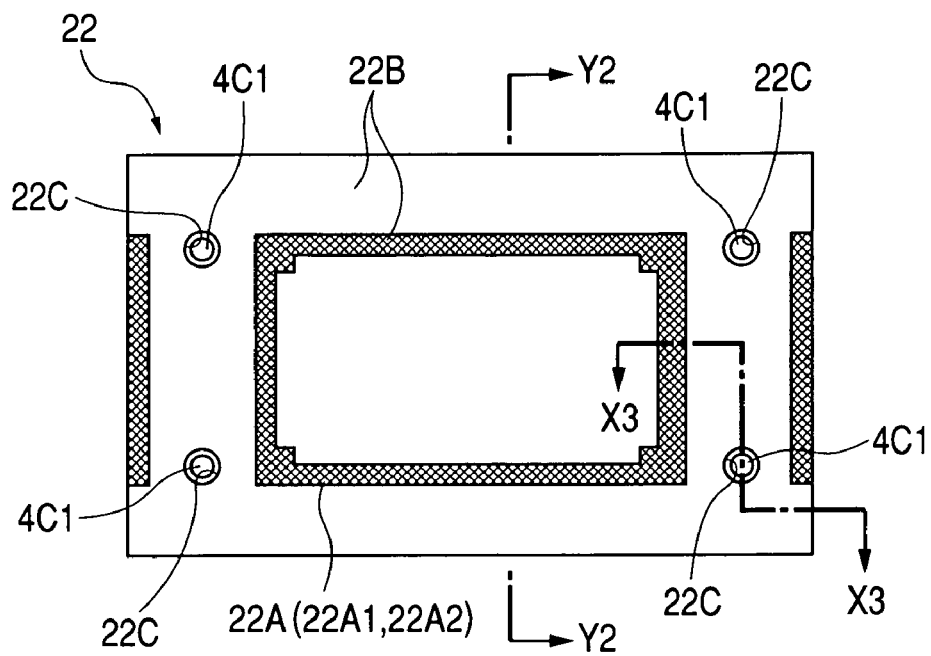
FIG. 24 is a diagram showing a top view of a unit area of a metallic mask used in the bonding process shown in FIG. 22.
Figure 25:
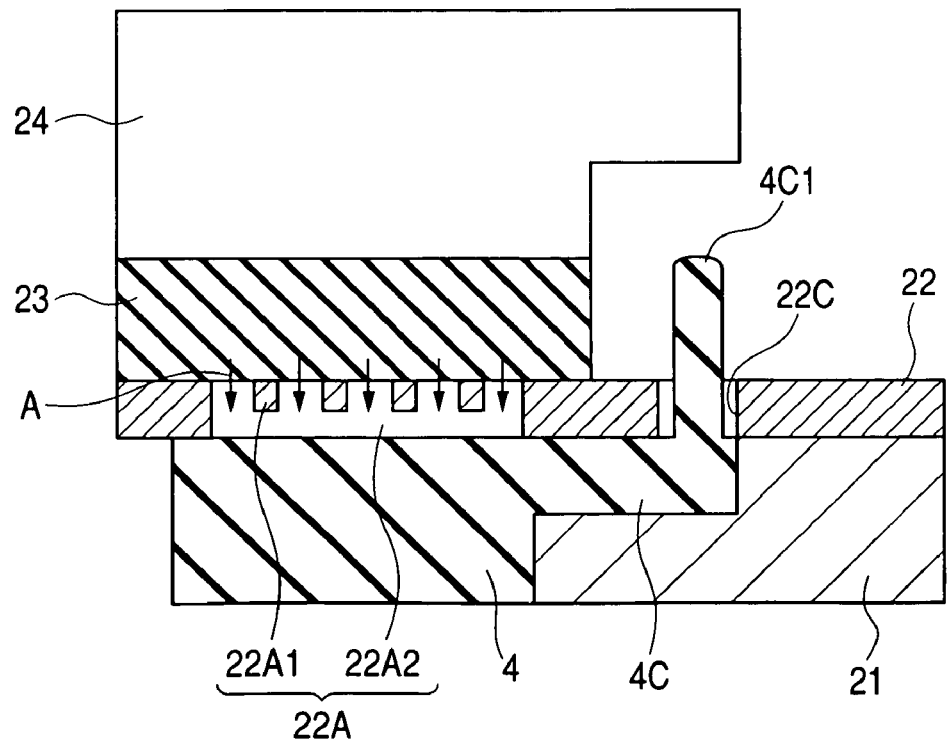
FIG. 25 is a diagram showing a cross section along an X3—X3 line shown in FIG. 24.
Figure 26:
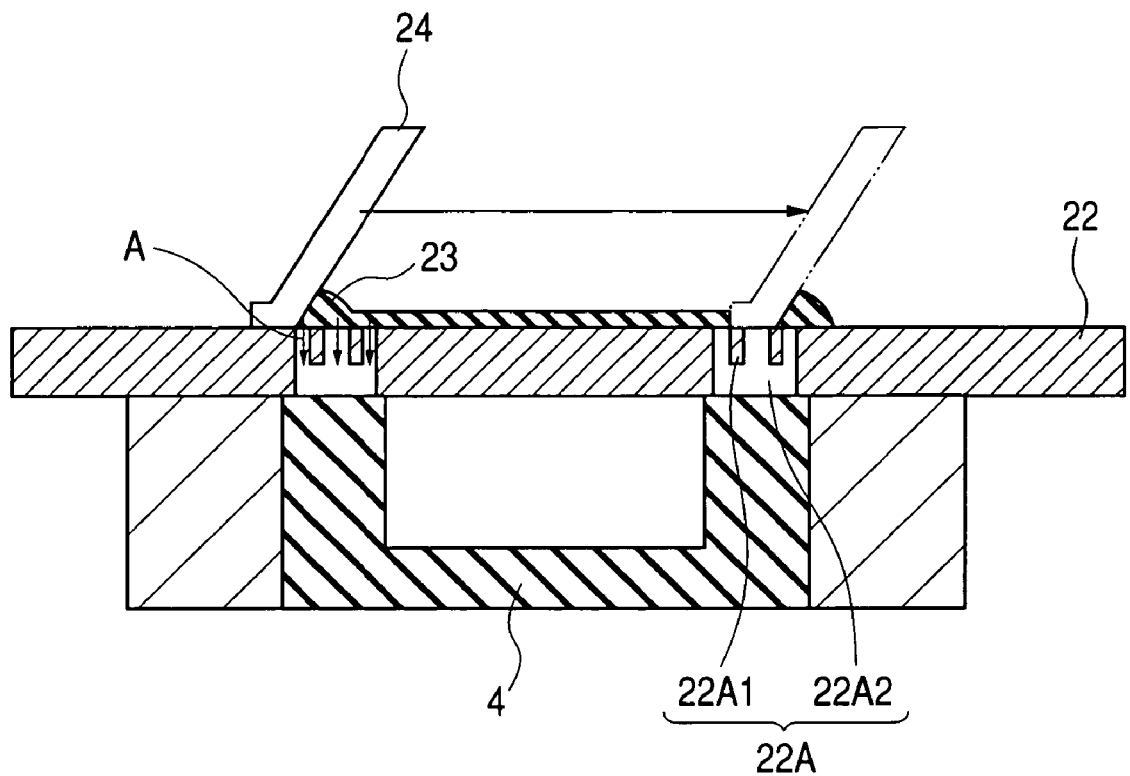
FIG. 26 is a diagram showing a cross section along a Y2—Y2 line shown in FIG. 24.

FIG. 24 is a diagram showing a top view of a unit area of the metallic mask 22 used in the process to bond lens barrels 4. The unit area is an area occupied by one lens barrel 4. FIG. 25 is a diagram showing a cross section along an X3—X3 line shown in FIG. 24. FIG. 26 is a diagram showing a cross section along a Y2—Y2 line shown in FIG. 24. A print area 22A shown in FIG. 24 as a top view of a frame corresponds to the bonding-agent-coating area on the rear face of the lens barrel 4. The outside and inside of the print area 22A are used as a mask area 22B. In an area close to each of the four sides of the print area 22A, a through hole 22C is formed to penetrate the metallic mask 22 from the upper face to the lower face. The position adjustment pin 4C1 of the lens barrel 4 is inserted into the through hole 22C.

In this embodiment, the print area 22A of the metallic mask 22 is divided into a network portion 22A1 occupying spaces in the upper half in the depth direction of the metallic mask 22 and a hollow portion 22A2 occupying the rest of the metallic mask 22. The metallic mask 22 is mounted on the lens-barrel jig 21 in such a way that, in the bonding-agent-coating process, the hollow portion 22A2 is exposed to the rear face of the lens barrel 4. The bonding agent 23 applied to the upper face of the metallic mask 22 is injected into the hollow portion 22A2 by way of infinitesimal openings of the network portion 22A1 as shown by arrow A in FIGS. 25 and 26. The rear face of the lens barrel 4 is then coated with the bonding agent 23 accommodated in the hollow portion 22A2.

The network portion 22A1 is formed by carrying out an etching process on a metal plate used as the basic material of the metallic mask 22 to form a net pattern. On the other hand, the hollow portion 22A2 is formed by carrying out an etching process to remove a portion of the metal plate used as the basic material of the metallic mask 22 up to a depth ending at a level in the middle of the thickness of the metallic mask 22. Instead of forming a network portion 22A1 in the metallic mask 22, holes completely penetrating the metallic mask 22 from the upper face to the lower face can be formed. In this case, however, a suspension pattern for suspending a center mask area 22B is required in the print area 22A. Thus, it becomes impossible to coat the rear-face portion of the lens barrel 4 with the bonding agent 23 due to the fact that the suspension pattern becomes a mask. Accordingly, a gap is generated at the rear-face portion between the lens barrel 4 and the wiring substrate mother board 1. As a result, foreign matters are injected into the lens barrel 4 by way of the gap, lowering the yield of the camera module CM in some cases. In the case of the embodiment, on the other hand, the network portion 22A1 is formed so that the center mask area 22B can be supported without providing a wide suspension pattern. Thus, the entire rear face of the lens barrel 4 can be coated with the bonding agent 23.

Figure 27:
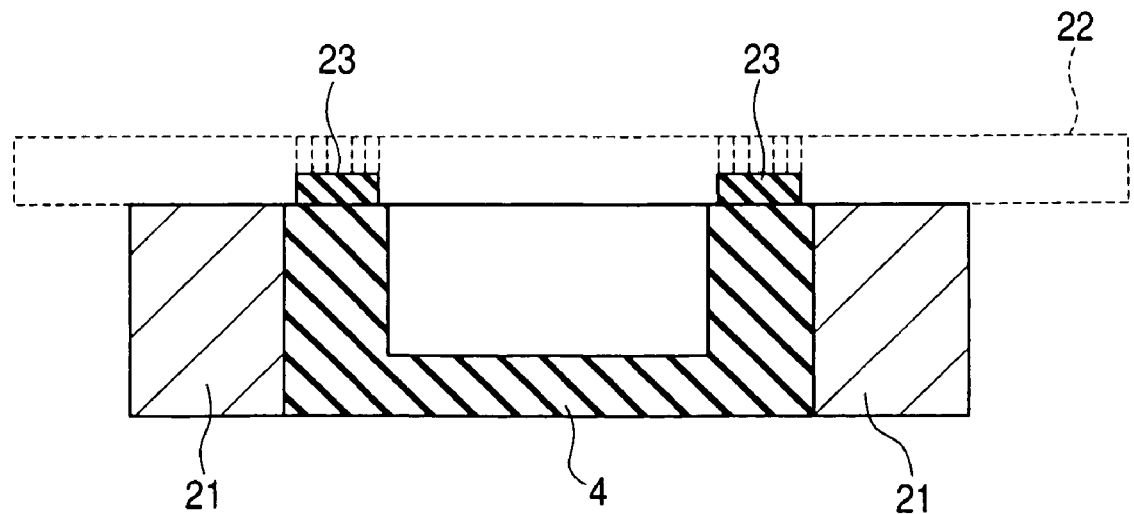
FIG. 27 is a diagram showing a cross section at a position on the Y—Y2 line shown in FIG. 24 with the metallic mask removed from FIG. 26.

In addition, the bonding agent 23 applied to the rear face of the lens barrel 4 does not return to the supply side either due to the existence of the network portion 22A1. FIG. 27 is a diagram showing the state of the bonding agent 23 printed on the rear face of the lens barrel 4 with the metallic mask 22 removed. On the rear face of the lens barrel 4, the bonding agent 23 is formed into the shape of the metallic mask 22 formed in the hollow portion 22A2. In accordance with the embodiment, the coating quantity of the bonding agent 23 printed on the rear face of the lens barrel 4 can be determined from the depth of the hollow portion 22A2. It is thus possible to control the coating amount (the thickness of the coating film) of the bonding agent 23 on the entire rear face of the lens barrel 4 with a high degree of precision. As a result, in accordance with the embodiment, the entire bonding face of the rear face of the lens barrel 4 can be coated with the bonding agent 23 uniformly.

Figure 28:
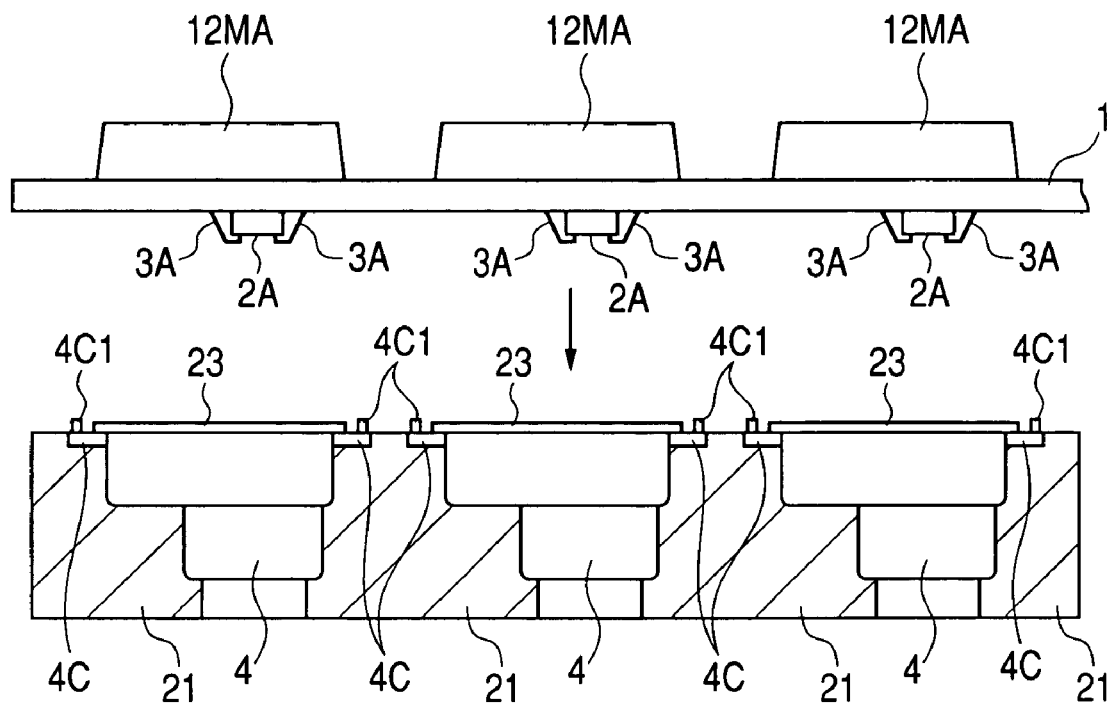
FIG. 28 is an explanatory diagram showing a process of bonding a lens barrel following the process shown in FIG. 22.
Figure 29:
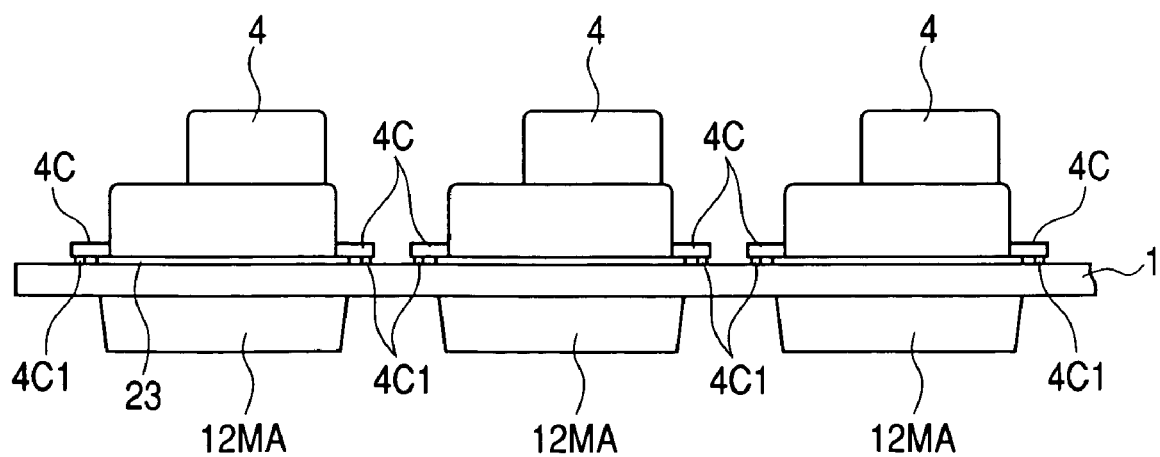
FIG. 29 is an explanatory diagram showing a process of bonding a lens barrel following the process shown in FIG. 28.

Then, after the rear face of the lens barrel 4 is coated with the bonding agent 23 and the metallic mask 22 is removed as described above, the wiring substrate mother board 1 after the manufacturing process explained by referring to FIG. 14 is exposed to the lens barrels 4 accommodated in the lens-barrel jig 21 as shown in FIG. 28. To be more specific, the optical-component-mounting face of the wiring substrate mother board 1, that is, the face on which the chip sensors 2A of the wiring substrate mother board 1 are mounted, is exposed to the rear faces of the lens barrels 4 accommodated in the lens-barrel jig 21. Then, with the planar positions of the lens barrels 4 adjusted with respect to the wiring substrate mother board 1, the wiring substrate mother board 1 is pushed toward the lens barrels 4 so that the optical-component-mounting face of the wiring substrate mother board 1 is stuck on the rear faces of the lens barrels 4 by the bonding agent 23. In pushing the wiring substrate mother board 1 toward the lens barrels 4, the planar positions of the lens barrels 4 are adjusted with respect to the wiring substrate mother board 1 by inserting the position adjustment pin 4C1 of each of the lens barrels 4 into a through hole 16 provided on the wiring substrate mother board 1. By carrying out the operations described above, the wiring substrate mother board 1 and the lens barrels 4 are joined to each other. In this embodiment, the entire rear face of the lens barrel 4 can be coated with the bonding agent 23 uniformly. Accordingly, the entire rear face of the lens barrel 4 can be stuck substantially on the optical-component-mounting face of the wiring substrate mother board 1 without forming a gap. It is thus possible to reduce the quantity of foreign matters flowing into the lens barrel 4 or even possible to completely prevent the foreign matters from flowing into the lens barrel 4. As a result, since the rate of generation of black-point defects caused by introduction of the foreign matters can be reduced, the yield of the camera module CM can be increased.

Figure 30:
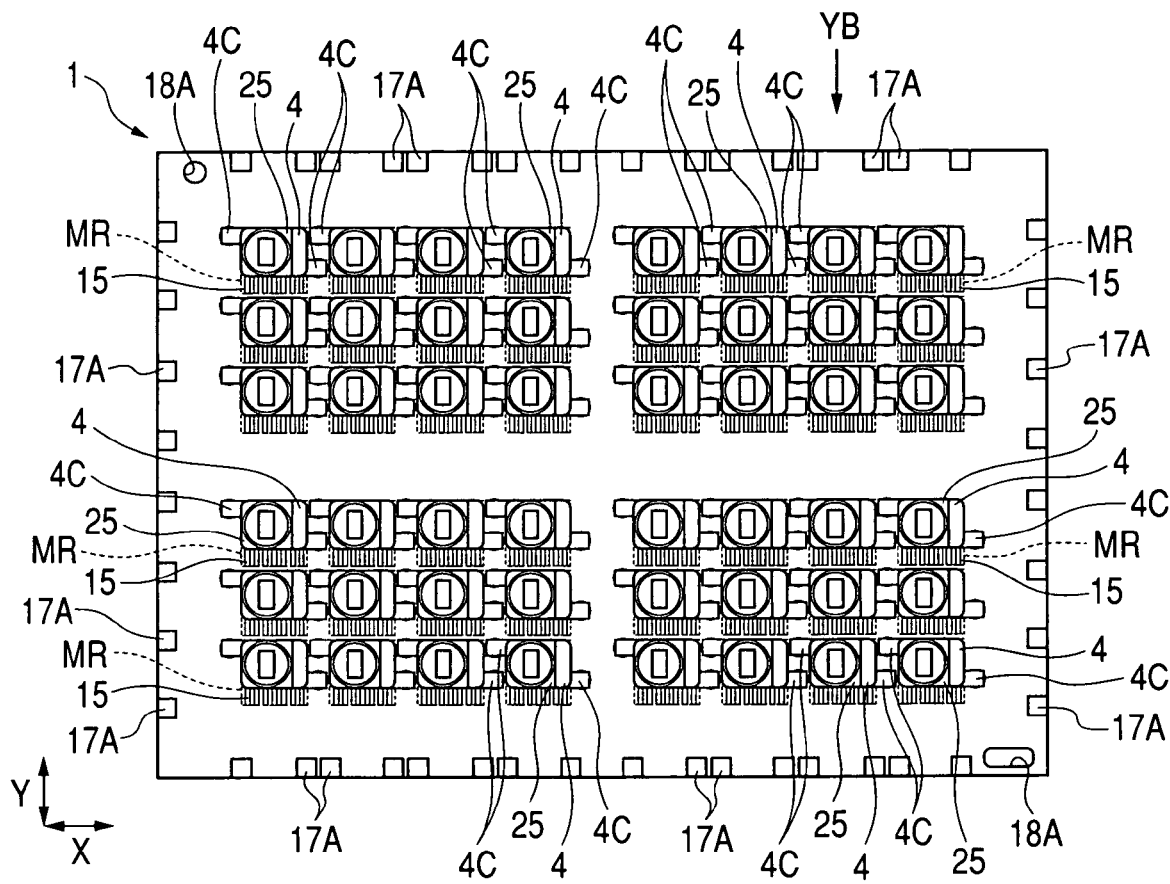
FIG. 30 is a diagram showing a top view of the entire second face of the wiring substrate mother board after a process to stick a protection film.
Figure 31:
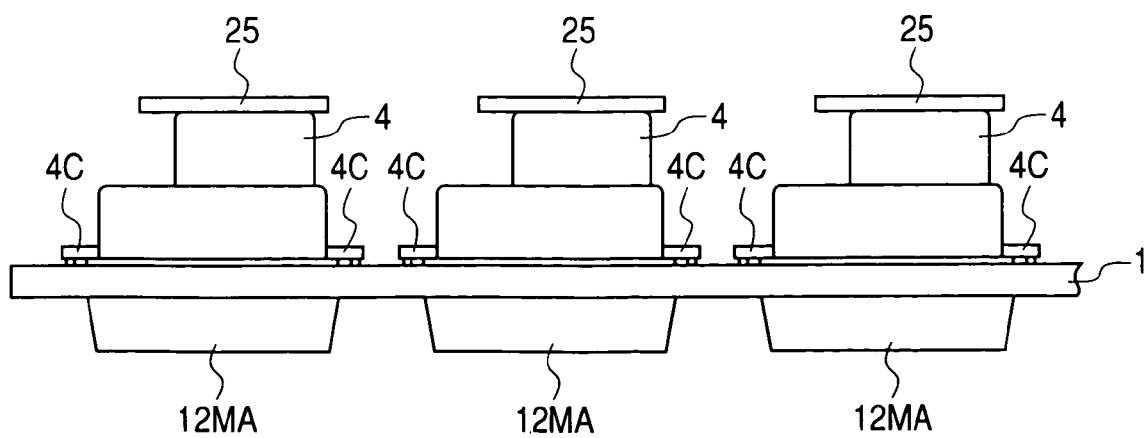
FIG. 31 is a side-view diagram showing main components with the wiring substrate mother board seen in a horizontal direction indicated by an arrow YB shown in FIG. 30.
Figure 32:
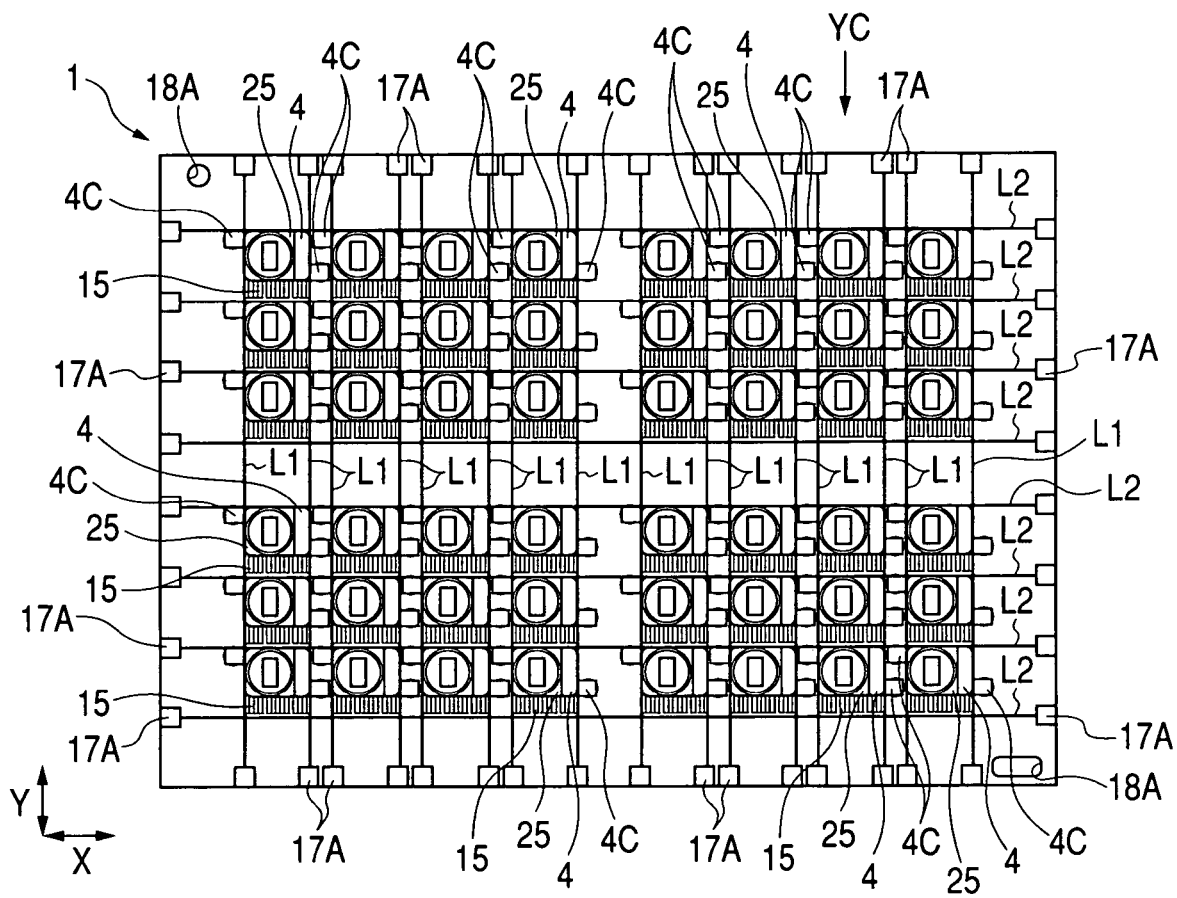
FIG. 32 is a diagram showing a top view of the entire first face of the wiring substrate mother board after a full dicing process.
Figure 33:
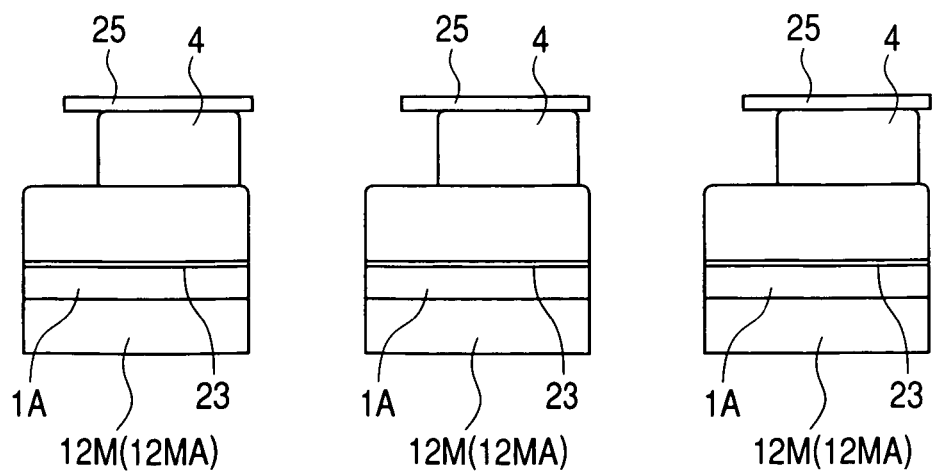
FIG. 33 is a side-view diagram showing main components with the wiring substrate mother board seen in a horizontal direction indicated by an arrow YC shown in FIG. 32.

Next, after a plurality of lens barrels 4 is joined to the optical-component-mounting face of the wiring substrate mother board 1 as described above, a protection film 25 is stuck on the lens barrel 4 so as to block the opening on the head of the lens barrel 4 as shown in FIGS. 30 and 31. FIG. 30 is a diagram showing a top view of the entire optical-component-mounting face of the wiring substrate mother board 1 after the process to stick the protection film 25. FIG. 31 is a side-view diagram showing main components with the wiring substrate mother board 1 seen in a horizontal direction indicated by an arrow YB shown in FIG. 30. Foreign matters stuck on the IR filter 5 inside a lens barrel 4 will cause a stain defect, which is a defect generated by a shadow thrown over the sensor chip 2A due to a blurred image of the foreign matters on the IR filter 5. The protection film 25 is thus provided as a protection member for preventing the foreign matters from entering the lens barrel 4 in the course of a subsequent manufacturing process. Then, as shown in FIGS. 32 and 33, with the protection film 25 stuck as it is, a full dicing process is carried out on the wiring substrate mother board 1 to completely split the wiring substrate mother board 1 into individual wiring substrates 1A. FIG. 32 is a diagram showing a top view of the entire system-component-mounting face of the wiring substrate mother board 1 after this full dicing process. FIG. 33 is a side-view diagram showing main components with the wiring substrate mother board 1 seen in a horizontal direction indicated by an arrow YC shown in FIG. 32. The dicing process is carried out, starting from the optical-component-mounting face on which lens barrels 4 are mounted. Dicing lines L1 and L2 are each a line along which the wiring substrate mother board 1 is to be cut by using a dicing saw. The dicing line L1 is a straight line extended in the second direction Y shown in FIG. 32. On the other hand, the dicing line L2 is a straight line extended in the first direction X perpendicular to the dicing line L1. In the dicing process, the protrusions 4C of the lens barrels 4 and the position adjustment pins 4C1 of the protrusions 4C are also cut. In addition, the side portions of the batch encapsulation bodies 12MA are cut as well so that a side face of the encapsulation body 12M is formed all but perpendicularly to the lower and upper faces of the wiring substrate 1A.

Figure 34:
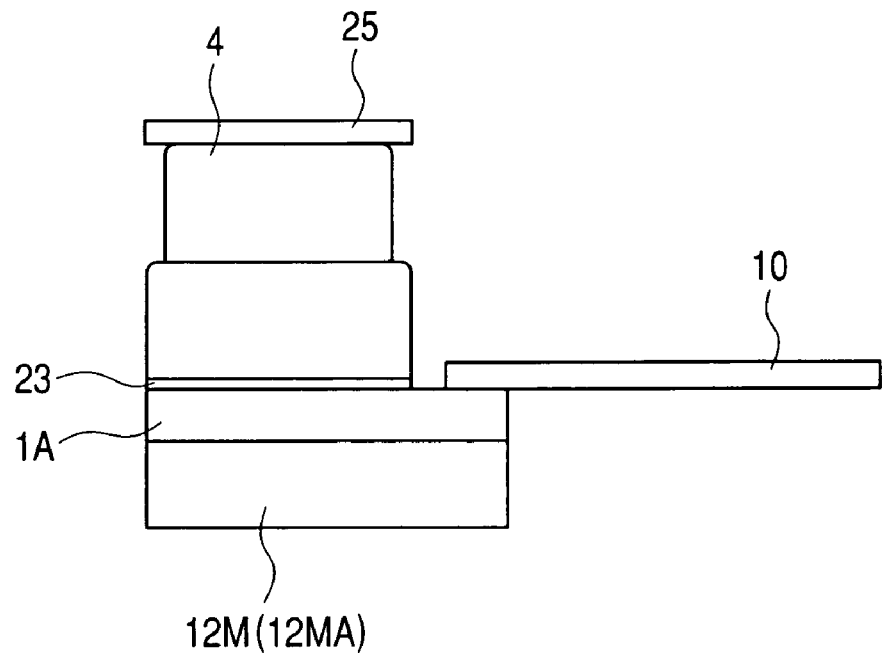
FIG. 34 is a diagram showing a side view in the course of a process to manufacture the solid-state image sensing device following the state shown in FIG. 33.
Figure 35:
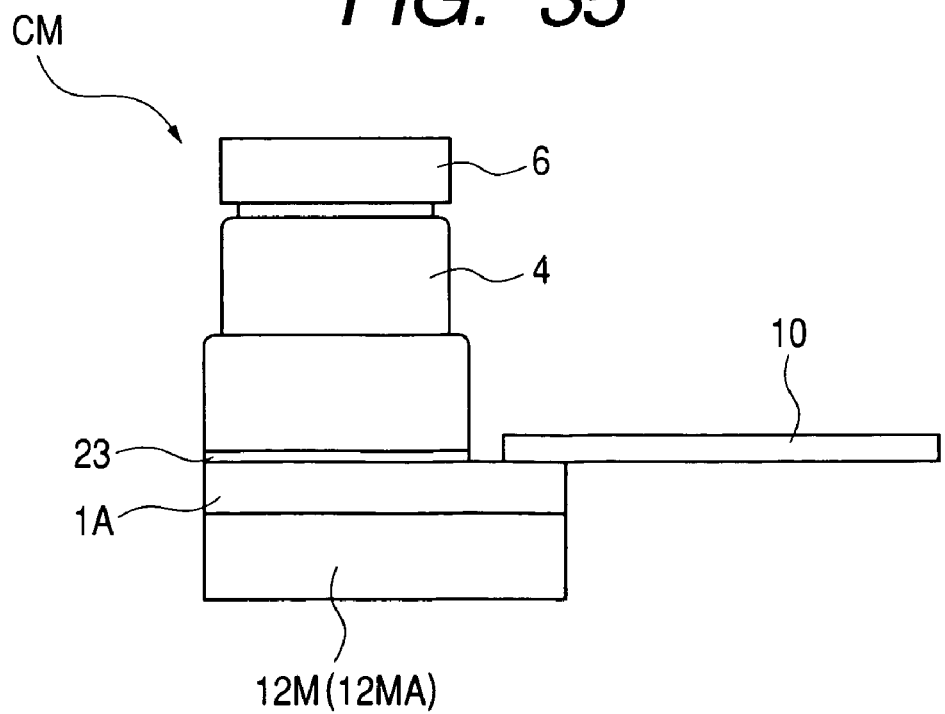
FIG. 35 is a diagram showing a side view in the course of a process to manufacture the solid-state image sensing device following the state shown in FIG. 34.

Then, as shown in FIG. 34, with the protection film 25 stuck thereon as it is, the connection terminals 15 are joined to wires of the flexible wiring substrate 10 by using the junction member 9 such as an ACF. Subsequently, after the protection film 25 is peeled off, as shown in FIG. 35, the lens holder 6 including the embedded optical lens 7 is installed on the head of the lens barrel 4. The linkage portion of the lens holder 6 and the lens barrel 4 is further coated with a bonding agent to fix the lens holder 6 on the lens barrel 4 substantially. By carrying out the processes described above, the camera module CM shown in FIG. 1 is manufactured.

In the above description, the present invention discovered by inventors is explained concretely on the basis of embodiments. However, the scope of the present invention is not limited to the embodiments. It is of course possible to make a variety of changes in a domain not deviating from essentials of the present invention to the embodiments.

For example, another kind of electrical-insulation material can be used as the electrical-insulation material of the wiring substrate 1A of the camera module CM. Examples of the other electrical-insulation material are the BT resin and the aramid non-fabric material.

The above description explains the present invention applied mainly to a camera module employing a CMOS image sensor, which is a sensor in a field serving as the background of the present invention discovered by the inventors. However, the scope of the present invention is not limited to such a camera module. For example, the present invention can also be applied to a camera module employing a CCD (Charge Coupled Device) image sensor.

What is claimed is:

1. A method of manufacturing a solid-state image sensing device comprising the steps of:
   (a) preparing a wiring substrate mother board having a first face and a second face on the side opposite to said first face;
   (b) mounting first electronic components over said first face of said wiring substrate mother board;
   (c) encapsulating said first electronic components by using an encapsulation body;
   (d) mounting second electronic components including image sensors over said second face of said wiring substrate mother board; and
   (e) joining a frame to said second face of said wiring substrate mother board so as to cover said second electronic components,
   wherein said frame has a position adjustment pin for adjusting the position of said frame with said wiring substrate mother board,
   wherein said wiring substrate mother board has a through hole into which said position adjustment pin is to be inserted, and
   wherein said position adjustment pin and said through hole are provided outside a junction face between said frame and said wiring substrate mother board,
   wherein said step (e) includes a sub-step of selectively coating a junction face of said frame with a bonding agent through a mask, and said sub-step of selectively coating a junction face of said frame with a bonding agent is carried out in such a way that said position adjustment pin of said frame is not coated with said bonding agent.

2. The method of manufacturing a solid-state image sensing device according to claim 1, wherein in said step (c), said encapsulation body is formed in such a way that said through hole of said wiring substrate mother board is avoided.

3. The method of manufacturing a solid-state image sensing device according to claim 1,
   wherein said wiring substrate mother board has a plurality of module regions,
   wherein said encapsulation body used in said step (c) is a batch encapsulation body for encapsulating said first electronic components in said module regions in the aggregate, and
   wherein in said step (c), said batch encapsulation body is formed in such a way that said through hole of said wiring substrate mother board is avoided.

4. The method of manufacturing a solid-state image sensing device according to claim 3, wherein in said step (c), a plurality of said batch encapsulation bodies is formed over said first face of said wiring substrate mother board with said batch encapsulation bodies being separated from each other.

5. The method of manufacturing a solid-state image sensing device according to claim 4, wherein a depression is formed in a portion of each of said batch encapsulation bodies.

6. The method of manufacturing a solid-state image sensing device according to claim 3, wherein in said step (c), said module regions are divided into a plurality of groups and a plurality of said first electronic components in each of said groups is encapsulated in the aggregate.

7. The method of manufacturing a solid-state image sensing device according to claim 6, wherein in said step (c), an encapsulation material is supplied to any particular one of said groups through an encapsulation-material-supplying path provided for said particular one of said groups so as to form said encapsulated body for said particular one of said groups in the aggregate.

8. The method of manufacturing a solid-state image sensing device according to claim 1, wherein said image sensors are each a CMOS image sensor.

* * * * *